US012635222B2

(12) United States Patent
Na et al.

(10) Patent No.: US 12,635,222 B2
(45) Date of Patent: May 19, 2026

(54) METHOD OF DESIGNING LAYOUT OF SEMICONDUCTOR DEVICE AND METHOD OF MANUFACTURING SEMICONDUCTOR DEVICE

(71) Applicant: Samsung Electronics Co., Ltd., Suwon-si (KR)

(72) Inventors: Yeojin Na, Hwaseong-si (KR); Juyun Park, Seongnam-si (KR); Jongdoo Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 835 days.

(21) Appl. No.: 18/061,789

(22) Filed: Dec. 5, 2022

(65) Prior Publication Data

US 2023/0290686 A1 Sep. 14, 2023

(30) Foreign Application Priority Data

Mar. 10, 2022 (KR) ......................... 10-2022-0029993

(51) Int. Cl.
| | |
|---|---|
| *H10D 89/10* | (2025.01) |
| *G06F 30/392* | (2020.01) |
| *G06F 30/398* | (2020.01) |
| *H10D 84/01* | (2025.01) |
| *H10D 84/03* | (2025.01) |

(52) U.S. Cl.
CPC ......... *H10D 84/038* (2025.01); *G06F 30/392* (2020.01); *G06F 30/398* (2020.01); *H10D 84/0128* (2025.01); *H10D 84/013* (2025.01)

(58) Field of Classification Search
CPC ....... H10D 89/10; G06F 30/39; G06F 30/392; G06F 30/394; G06F 30/398
See application file for complete search history.

(56) References Cited

U.S. PATENT DOCUMENTS

| | | | |
|---|---|---|---|
| 7,444,609 | B2 | 10/2008 | Charlebois et al. |
| 8,136,072 | B2 | 3/2012 | Frederick |
| 8,239,799 | B2 | 8/2012 | Riviere-Cazaux |
| 9,627,370 | B1 | 4/2017 | Lam et al. |
| 10,635,775 | B2 | 4/2020 | Lee et al. |
| 2018/0006010 | A1 | 1/2018 | Lo et al. |
| 2021/0151426 | A1 | 5/2021 | Chae et al. |
| 2021/0165946 | A1 | 6/2021 | Chae et al. |

FOREIGN PATENT DOCUMENTS

| | | |
|---|---|---|
| KR | 2002/0022120 A | 3/2002 |
| KR | 2021/0067761 A | 6/2021 |

*Primary Examiner* — Reema Patel
(74) *Attorney, Agent, or Firm* — Fish & Richardson P.C.

(57) ABSTRACT

A method of designing a layout of a semiconductor device includes forming a second layout by analyzing a first layout and correcting at least a portion of a plurality of filler cells, wherein the forming the second layout includes detecting transition regions due to a difference in width by respectively comparing a first width of a first active line and a second width of a second active line with a width of a dummy active line, in the first layout; and correcting the dummy active line of the first filler cell by analyzing the detected transition regions, wherein, in the correcting the dummy active line of the first filler cell, the dummy active line is corrected to be a corrected dummy active line having the same width as an active line having a narrower width, among the first and second active lines.

20 Claims, 19 Drawing Sheets

START

CIRCUIT DESIGN ~S10

LAYOUT FORMATION ~S20

LAYOUT CORRECTION ~S30

MASK FORMATION ~S40

SEMICONDUCTOR
DEVICE FORMATION ~S50

END

START

DESIGN PLURALITY OF
STANDARD CELLS AND
PLURALITY OF FILLER CELLS — S100

DISPOSE PLURALITY OF
STANDARD CELLS — S200

DISPOSE PLURALITY OF FILLER
CELLS BETWEEN PLURALITY OF
STANDARD CELLS TO FORM
FIRST LAYOUT — S300

ANALYZE FIRST LAYOUT AND
CORRECT AT LEAST PORTION OF
FILLER CELLS AMONG
PLURALITY OF FILLER CELLS TO
FORM SECOND LAYOUT — S400

END

METHOD OF DESIGNING LAYOUT OF SEMICONDUCTOR DEVICE AND METHOD OF MANUFACTURING SEMICONDUCTOR DEVICE

CROSS-REFERENCE TO RELATED APPLICATION(S)

This application claims benefit of priority to Korean Patent Application No. 10-2022-0029993 filed on Mar. 10, 2022 in the Korean Intellectual Property Office, the disclosure of which is incorporated herein by reference in its entirety.

BACKGROUND

Various example embodiments relate to a method of designing a layout of a semiconductor device and/or a method of manufacturing the semiconductor device.

Standard cells may be used for designing a semiconductor device including an integrated circuit. The standard cells may be cells having a particular, e.g. a predetermined architecture, and may be stored in a cell library. When designing the semiconductor device, the standard cells may be extracted from the cell library, and may be disposed in appropriate positions on a layout of the semiconductor device. When designing a semiconductor device, filler cells may be disposed in a dummy region in which an integrated circuit is not disposed, and research into optimizing or improving a design of the filler cells is being conducted.

SUMMARY

Various example embodiments provide a method of designing a layout of a semiconductor device and/or a method of manufacturing the semiconductor device, having improved integration and/or reliability.

According to some example embodiments, a method of designing a layout of a semiconductor device includes placing a plurality of standard cells; forming a first layout by placing a plurality of filler cells between the plurality of standard cells; and forming a second layout by analyzing the first layout and correcting at least a portion of the plurality of filler cells. The plurality of standard cells includes a first standard cell including a first active line having a first width, and a second standard cell including a second active line having a second width, different from the first width, in the first layout. The plurality of filler cells includes a first filler cell including a dummy active line connected to the first active line and the second active line, and dummy gate lines intersecting the dummy active line in the first layout. The forming the second layout includes detecting transition regions due to a difference in width by respectively comparing the first width of the first active line and the second width of the second active line with a width of the dummy active line in the first layout. The method further includes correcting the dummy active line of the first filler cell by analyzing the detected transition regions. In the correcting the dummy active line of the first filler cell, the dummy active line is corrected to be a corrected dummy active line having the same width as an active line having a narrower width, among the first and second active lines, wherein a corrected transition region is formed between an active line having a wider width, among the first and second active lines, and the corrected dummy active line, and wherein the corrected transition region overlaps a first dummy gate line located on a first boundary of the first filler cell, among the dummy gate lines.

According to some example embodiments, a method of manufacturing a semiconductor device includes forming a semiconductor layout using a method of designing a layout of the semiconductor device; forming a mask using the semiconductor layout; and forming the semiconductor device using the mask. In the forming the semiconductor device, a first active pattern having a third width in a first device region corresponding to the first standard cell, a second active pattern having a fourth width, different from the third width in a second device region corresponding to the second standard cell, a dummy active pattern placed between the first and second device regions and having a fifth width, equal to a narrower width, among the third width and the fourth width, the placing in a dummy region corresponding to the first filler cell, and a first dummy gate pattern corresponding to the first dummy gate line on the first boundary are formed on a semiconductor substrate. A tapered region corresponding to the corrected transition region and continuously changing in width in plan view is formed. At least a portion of the tapered region overlaps the first dummy gate pattern, and a central portion of the tapered region is shifted from a central axis of the first dummy gate pattern in a direction away from the first boundary.

According to some example embodiments, a method of manufacturing a semiconductor device includes forming a semiconductor layout; forming a mask using the semiconductor layout; and forming the semiconductor device using the mask. The forming the semiconductor device includes forming a first active pattern on a first device region of a substrate, a second active pattern on a second device region of the substrate, and a dummy active pattern on a dummy region of the substrate; forming a plurality of first channel layers on the first active pattern, a plurality of second channel layers on the second active pattern, and a plurality of dummy channel layers on the dummy active pattern; and forming a first gate pattern surrounding at least a portion of the plurality of first channel layers, a second gate pattern surrounding at least a portion of the plurality of second channel layers, and dummy gate patterns surrounding at least a portion of the plurality of dummy channel layers. The first active pattern has a first width, the second active pattern has a second width, different from the first width, and the dummy active pattern has a width, equal to a narrower width, among the first width and the second width, a tapered region continuously changing in width in plan view is formed on the dummy active pattern, at least a portion of the tapered region overlaps a first dummy gate pattern in an outermost portion of the dummy region among the dummy gate patterns, and a central portion of the tapered region is located in the dummy region, and is shifted from a central axis of the first dummy gate pattern toward a central portion of the dummy region.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION

Hereinafter, some example embodiments of inventive concepts will be described with reference to the accompanying drawings.

Figure 1:
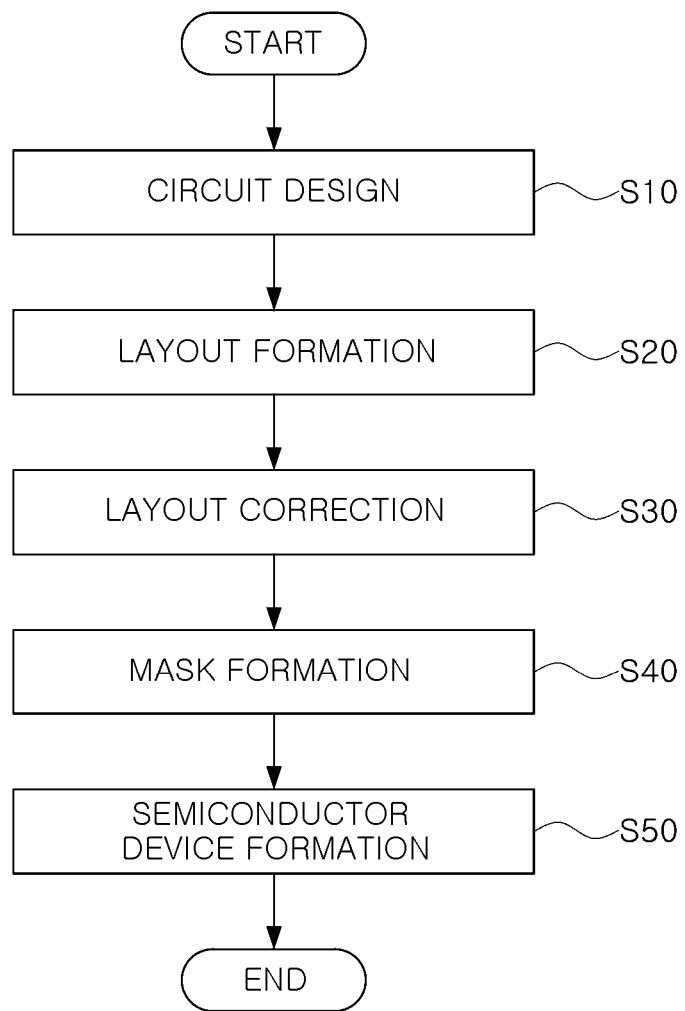
FIG. 1 is a flowchart illustrating a method of manufacturing a semiconductor device according to some example embodiments.

FIG. 1 is a flowchart illustrating a method of manufacturing a semiconductor device according to some example embodiments.

Referring to FIG. 1, a method of manufacturing a semiconductor device may include performing a circuit design operation (S10), a layout forming operation (S20), a layout correction operation (S30), a mask forming operation (S40), and a semiconductor device forming operation (S50).

The circuit design operation (S10) may include designing an integrated circuit of the semiconductor device, and may be performed using one or more tools for designing the circuit. The tools may be or may include a program including a plurality of instructions to be executed by a processor. Therefore, the circuit design operation (S10) of the semiconductor device may be or may include a computer implemented operation for designing the circuit.

The layout forming operation (S20) may include forming a layout to be used for manufacturing a mask using the integrated circuit. Standard cells stored in a standard cell library, and filler cells serving as a dummy region, may be disposed or arranged. A standard cell refers to a unit of or a portion of an integrated circuit, in which a size of a layout meets a specific, or alternatively, predetermined rule, and performs a specific or a predetermined function. The standard cell may include designs for an input pin and an output pin, and may designed to process a signal, received through the input pin, to output a signal through the output pin. For example, the standard cell may correspond to a basic cell such as an AND logic gate, an OR logic gate, a NOR logic gate, an inverter, or the like, a complex cell such as an OR/AND/INVERTER (OAI), an AND/OR/INVERTER (AOI), a multiplexer (MUX), a half-adder (ADDH), or the like, or a storage element such as a master-slave flip-flop, a latch, or the like. The standard cell library may include information on standard cells. For example, the standard cell library may include one or more of a name of a standard cell, information on functions, timing information, power information, layout information, or the like. The standard cell library may be stored in a storage such as a storage device, and the standard cell library may be provided by accessing the storage.

The layout correction operation (S30) may include analyzing a pattern of a first layout formed primarily and then correcting at least a portion of filler cells to form a second layout. Improved, or optimal shapes of the filler cells may be configured by providing or considering or listing up surrounding environmental conditions of the filler cells and in consideration of surrounding environment and device characteristics. Therefore, process issues that may occur in manufacturing the device may be reduced or minimized without increasing burden on the cell library due to diversification of types of filler cells.

In the mask forming operation (S40), a mask may be formed using a corrected layout using the above-described operation. The mask forming operation (S40) may include an operation of performing optical proximity correction (OPC) on layout data to generate mask data for forming various patterns on a plurality of layers, an operation of performing a dummy fill on the layout data, and an operation of manufacturing a mask based on the mask data. The optical proximity correction may be performed to correct a distortion which may occur in a photolithography process. The mask may be manufactured in a manner depicting layout patterns, for example, using a chromium thin film applied to a glass substrate or a quartz substrate, and may or may not be performed with an electron-beam (e-beam) writing process.

In the semiconductor device forming operation (S50), a semiconductor device may be formed or fabricated using the mask. The semiconductor device forming operation (S50) may be performed in a semiconductor process module. In the semiconductor device forming operation (S50), various types of exposure and etching processes may be repeatedly performed. Such processes may be repeatedly performed to sequentially form shapes of patterns configured when a layout is designed on a substrate such as a silicon substrate. Specifically, various semiconductor processes may be performed on a semiconductor substrate such as a wafer using a plurality of masks to fabricate a semiconductor device in which an integrated circuit is implemented. The semiconductor processes may include one or more deposition processes, one or more etching processes, one or more ion implantation processes, one or more cleaning processes, one or more annealing processes, one or more oxidation processes, one or more chemical-mechanical planarization (CMP) processes, and the like. In addition, the semiconductor process may include a packaging process of mounting a semiconductor device on a printed circuit board (PCB) and encapsulating the mounted semiconductor device with an encapsulant, and/or a test process for the semiconductor device or the package.

Figure 8A:
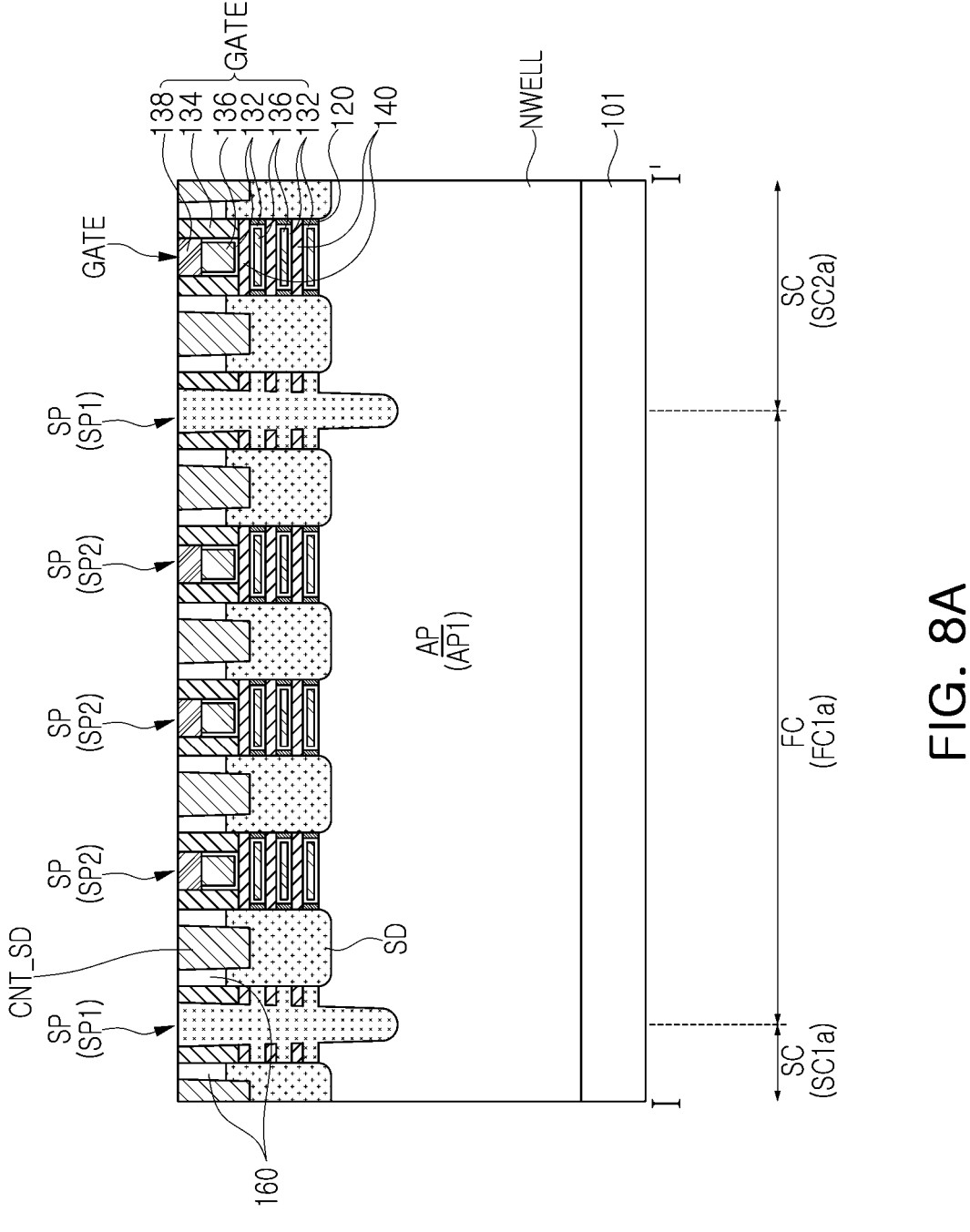
FIGS. 8A and 8B are cross-sectional views illustrating semiconductor devices according to some example embodiments.
Figure 8B:
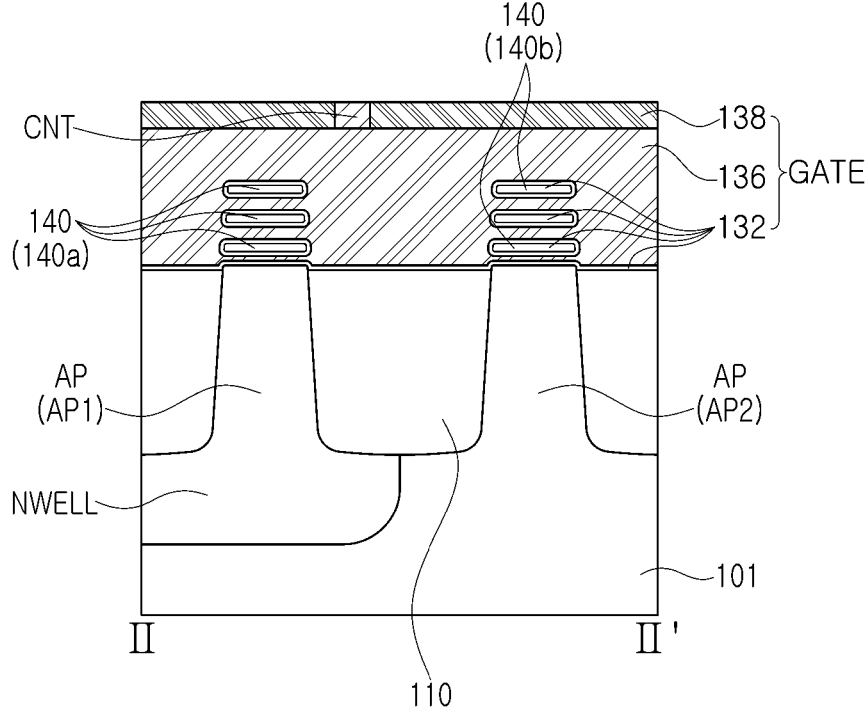

As an example, referring to FIGS. 8A and 8B, the semiconductor device forming operation (S50) may include forming a first active pattern (AP1 in the SC1a region) on a first device region SC1a of a substrate 101, a second active pattern (AP1 in the SC2a region) on a second device region SC2a of the substrate 101, and a dummy active pattern (AP1 in the FC1a region) on a dummy region FC1a of the substrate 101, forming first channel layers 140 on the first active pattern (AP1 in the SC1a region), second channel layers 140 on the second active pattern (AP1 in the SC2*a* region), and dummy channel layers 140 on the dummy active pattern (AP1 in the FC1*a* region), and forming a first gate pattern GATE surrounding at least a portion of the first channel layers 140, a second gate pattern GATE surrounding at least a portion of the second channel layers 140, and a dummy gate pattern SP surrounding at least a portion of the dummy channel layers 140.

For example, a tapered region TP1' continuously changing in width in plan view may be formed, and at least a portion of the tapered region TP1' may overlap a first dummy gate pattern SP1 disposed in an outermost portion of the dummy region FC1*a*. A central portion of the tapered region TP1' may be located in the dummy region FC1*a*, and may be shifted from a central axis of the first dummy gate pattern SP1 toward a central portion of the dummy region FC1*a*.

For example, at least one of the plurality of dummy channel layers 140 may be a tapered channel layer including a portion in which a width in plan view continuously changes in a region overlapping the first dummy gate pattern SP1. The portion in which a width in plan view continuously changes may provide an inclined surface to face the central portion of the dummy region FC1*a* in the plan view.

For example, the semiconductor device forming operation (S50) may include recessing the first active pattern (AP1 in the SC1*a* region) from both sides of the first gate pattern GATE, recessing the second active pattern (AP1 in the SC2*a* region) from both sides of the second gate pattern GATE, and recessing the dummy active pattern (AP1 in the FC1*a* region) from both sides of the dummy gate patterns SP, and forming first source/drain regions SD on the recessed first active pattern (AP1 in the SC1*a* region), second source/drain regions SD on the recessed second active pattern (AP1 in the SC2*a* region), and dummy source/drain regions SD on the recessed dummy active pattern (AP1 in the FC1*a* region).

Figure 2:
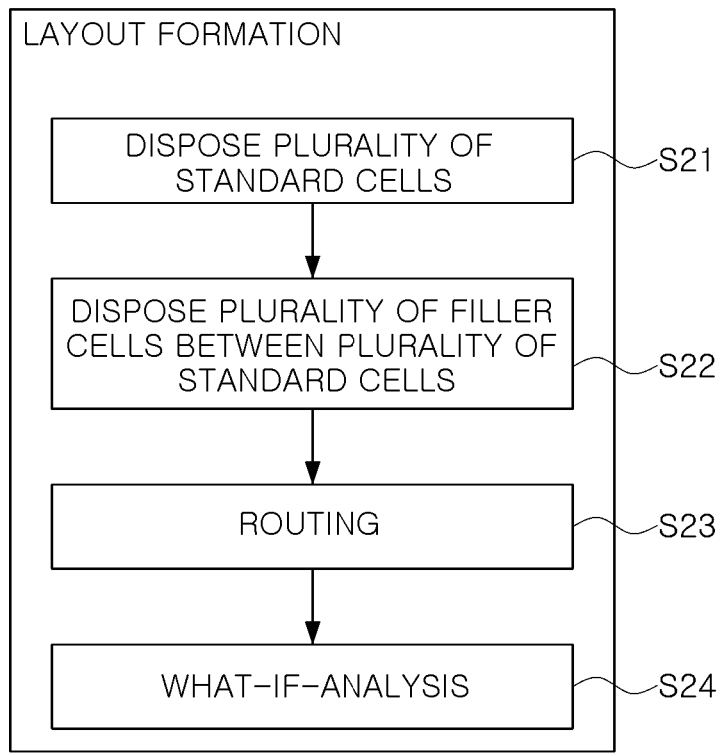
FIG. 2 is a flowchart illustrating an operation of forming a layout in a method of manufacturing a semiconductor device according to some example embodiments.

FIG. 2 is a flowchart illustrating an operation of forming a layout in a method of manufacturing a semiconductor device according to some example embodiments.

Referring to FIG. 2, the layout forming operation (S20) may include an operation of disposing or arranging a plurality of standard cells (S21), an operation of disposing or arranging a plurality of filler cells between the plurality of standard cells (S22), a routing operation (S23), and a what-if-analysis operation (S24).

The operation of arranging a plurality of standard cells (S21) may include disposing or arranging patterns of elements that are included in a circuit functional block. In the present operation, blank areas may be generated between the plurality of standard cells. The plurality of standard cells may include an operable semiconductor device, a unit circuit implemented by the semiconductor devices, or the like. In (S21), a shape or a size of a pattern for configuring transistors and interconnections to be actually formed on a silicon substrate may be defined. For example, layout patterns such as a PMOS transistor, an NMOS transistor, an N-WELL, a P-WELL, a gate electrode, and interconnections to be arranged thereon may be appropriately arranged to form an inverter circuit that will be patterned and fabricated on an actual substrate such as an actual silicon substrate.

The operation of arranging a plurality of filler cells between the plurality of standard cells (S22) may include disposing or arranging the plurality of filler cells, which may be or may include dummy regions, in empty regions generated between the plurality of standard cells. Dummy regions may include certain features that are part of a semiconductor device but that are not electrically active, and may instead be included to help support fabrication of the semiconductor device.

The routing operation (S23) may be an operation of generating an interconnection structure connecting a plurality of standard cells disposed thereon. The interconnection structure may be electrically connected to interconnections in the plurality of standard cells, and may electrically connect the plurality of standard cells to each other.

The what-if-analysis operation (S24) may be an operation of verifying and correcting the generated layout. Items to be verified may include design rule check (DRC) which may verify whether a layout is generated to be appropriate to a design rule, electrical rule check (ERC) which may verify whether the layout is appropriately generated without electrical disconnection therein, and layout vs schematic (LVS) which may check whether the layout matches a gate-level net list.

Figure 3:
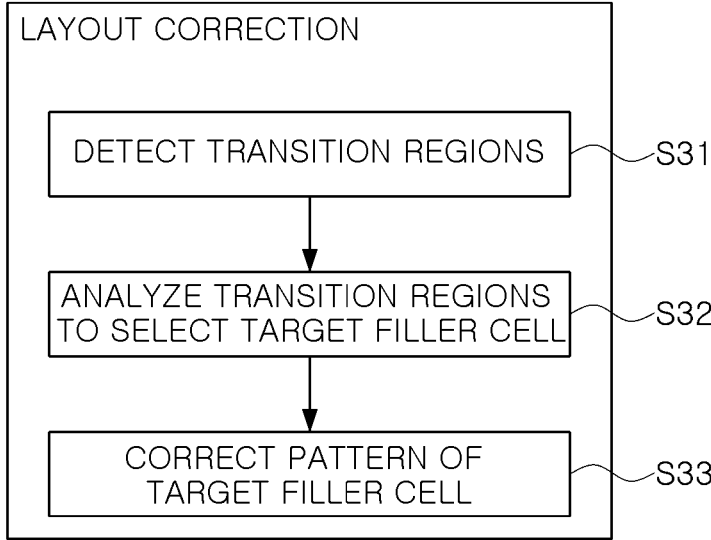
FIG. 3 is a flowchart illustrating an operation of correcting a layout in a method of manufacturing a semiconductor device according to some example embodiments.

FIG. 3 is a flowchart illustrating an operation of correcting a layout in a method of manufacturing a semiconductor device according to some example embodiments.

Referring to FIG. 3, the layout correction operation (S30) may include an operation of detecting transition regions (S31), an operation of analyzing the transition regions to select a target filler cell (S32), and an operation of correcting a pattern of the target filler cell (S33).

In the operation of detecting transition regions (S31), a respective width of active lines and a respective width of dummy active lines may be compared to detect transition regions generated by a difference in widths. The transition regions may be or may correspond to regions in which a width of an active line extending in the X-direction in the layout is discontinuously changed in a particular direction, such as in the Y-direction. For example, the detecting transition regions may listed as a region having discontinuously changing widths in regions in which the dummy line and the active lines are connected.

The analyzing the transition regions may include determining whether the transition regions is located on a boundary of filler cells among the transition regions to affect patterns of adjacent standard cells. The transition regions located on the boundary of the filler cells may cause a width of the active pattern of the standard cell in manufacturing the semiconductor device to be different from that initially designed, and may reduce reliability of device characteristics corresponding to the standard cell. Accordingly, to configure improved or optimal filler cells in consideration of surrounding environment and device characteristics of the filler cells, target filler cells requiring pattern correction may be selected. This will be further described with reference to FIGS. 6A to 6D.

Figure 4:
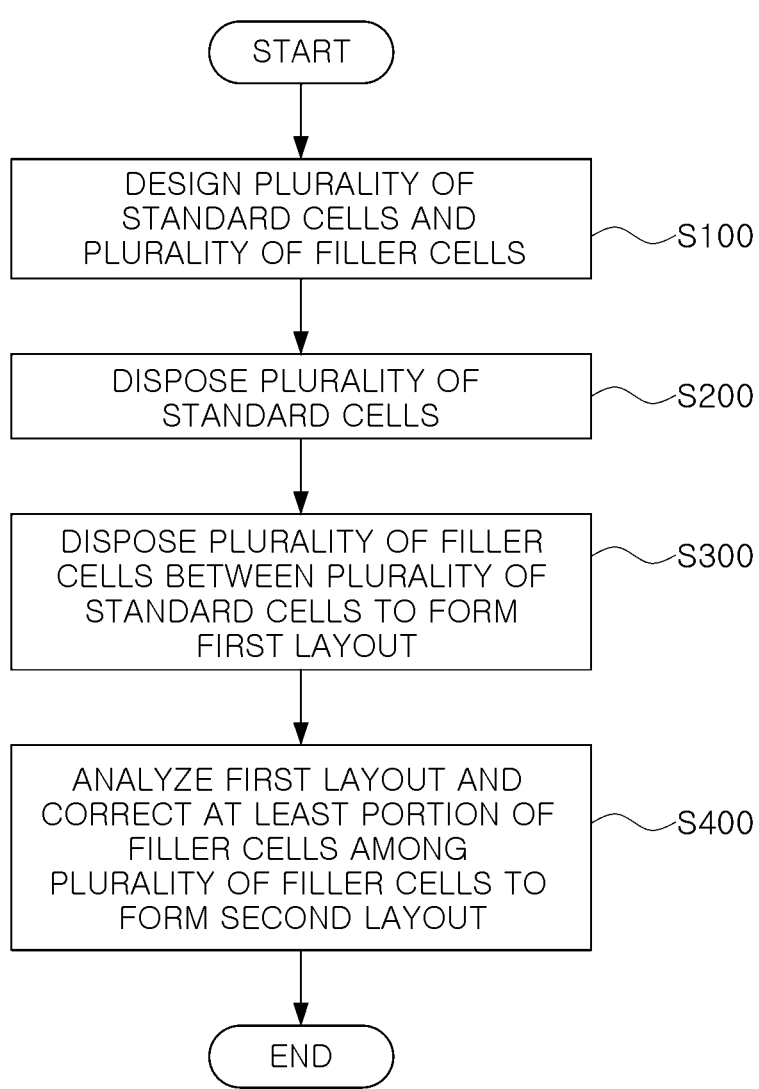
FIG. 4 is a flowchart illustrating a method of designing a layout of a semiconductor device according to some example embodiments.

FIG. 4 is a flowchart illustrating a method of designing a layout of a semiconductor device according to some example embodiments.

Referring to FIG. 4, a method of designing a layout of a semiconductor device may include an operation of designing a plurality of standard cells and a plurality of filler cells (S100), an operation of disposing or placing the plurality of standard cells (S200), disposing or placing the plurality of filler cells between the plurality of standard cells to form a first layout (S300), and an operation of analyzing the first layout and correcting at least a portion of the filler cells among the plurality of filler cells to form a second layout (S400).

In the first layout, the plurality of standard cells may include a first standard cell and a second standard cell, that are disposed or placed adjacent to each other, and the plurality of filler cells may include a first filler cell disposed or placed between the first standard cell and the second standard cell. Alternatively, in the first layout, the plurality of filler cells may include a first filler cell and a second filler cell, and the plurality of standard cells may include a first standard cell adjacent to the first filler cell, wherein the first filler cell may be arranged between the second filler cell and the first standard cell. In the first layout, as described above with reference to FIG. 3, transition regions may be detected. The detecting the transition regions may include comparing a width of each active line with a width of each dummy active line to find a portion that changes widths in regions in which the active line and the dummy active line are connected to each other. As described above with reference to FIG. 3, the dummy active line of the filler cell may be corrected by analyzing the detected transition regions. A method of designing a layout by correcting the layout will be further described with reference to FIGS. 6A to 6D as an example.

Figure 5A:
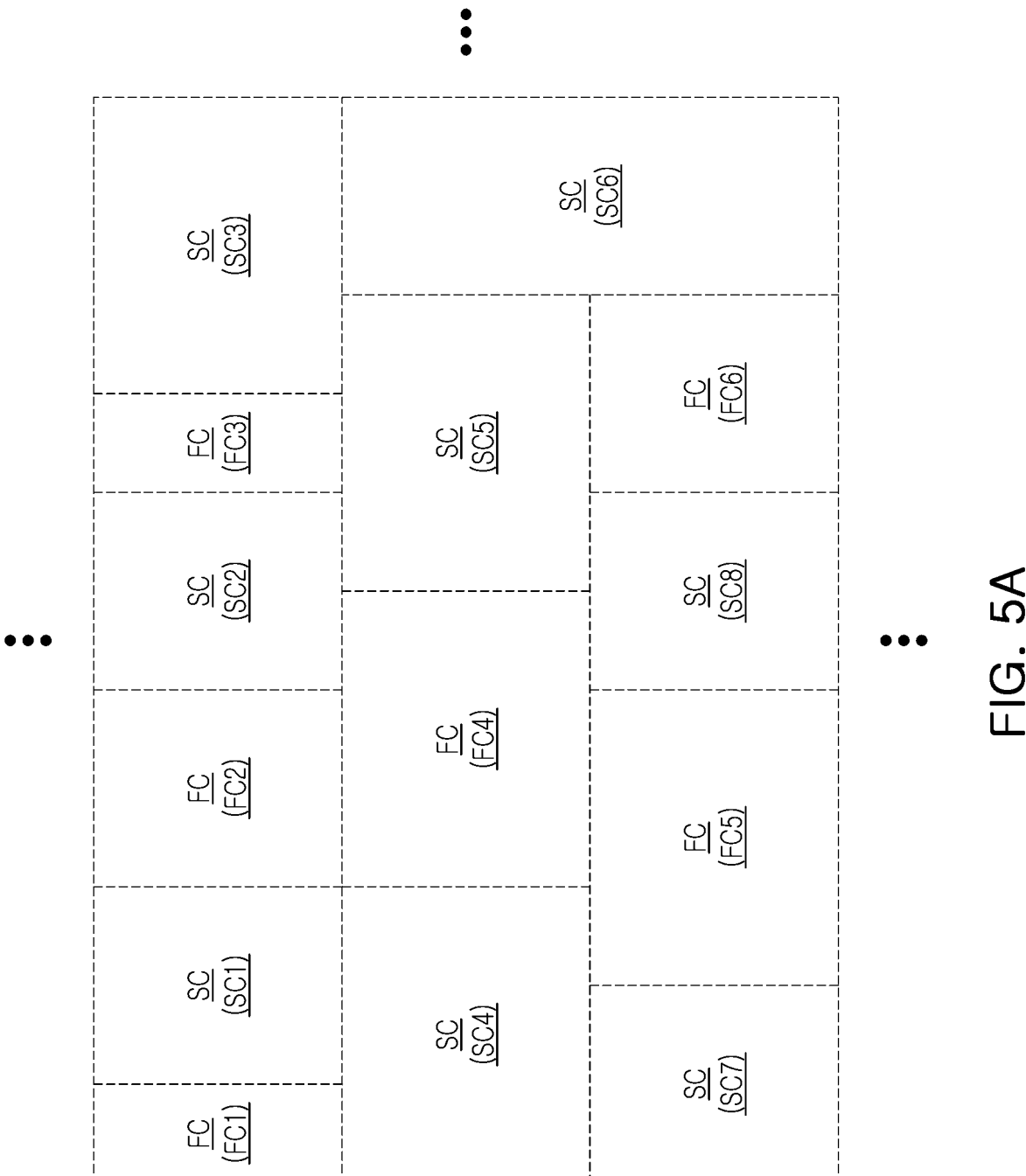
FIGS. 5A and 5B are plan views illustrating semiconductor devices according to some example embodiments.
Figure 5B:
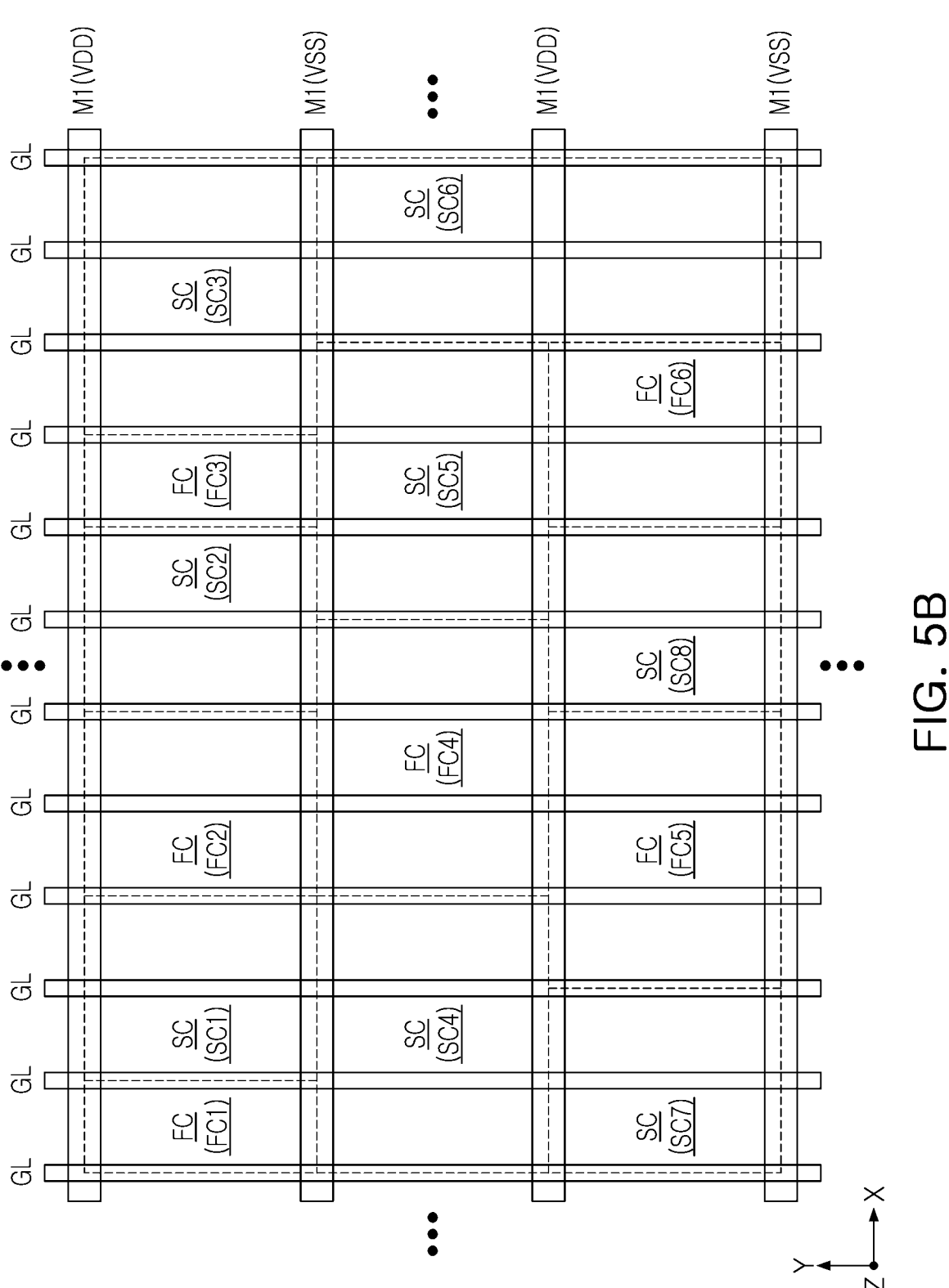

FIGS. 5A and 5B are plan views illustrating semiconductor devices according to some example embodiments.

A schematic planar shape or partial floorplan of a semiconductor device according to some example embodiments will be described with reference to FIGS. 5A and 5B.

FIG. 5A is a plan view illustrating a circuit region and a dummy region of a semiconductor device according to some example embodiments of inventive concepts, and FIG. 5B is a plan view further illustrating power interconnections M1 (e.g., VDD and VSS) and gate line patterns GL in the plan view of FIG. 5A.

Referring to FIGS. 5A and 5B, a plurality of standard cells SC and a plurality of filler cells FC adjacent to the plurality of standard cells SC may be disposed. The plurality of standard cells SC may be defined as a circuit region, and the plurality of filler cells FC may be defined as a dummy region.

Although the plurality of standard cells SC are illustrated as including first to eighth standard cells SC1 to SC8 in FIGS. 5A and 5B, inventive concepts may include standard cells arranged in more various forms. Although the plurality of filler cells FC are illustrated as including first to sixth filler cells FC1 to FC6 in FIGS. 5A and 5B, inventive concepts may include filler cell regions arranged in more various forms.

Power interconnections M1 (VDD and VSS) extending in a direction such as the X-direction may be disposed or arranged. The power interconnections M1 (VDD and VSS) may be spaced apart in the Y-direction, perpendicular to the X-direction. The power interconnections M1 (VDD and VSS) may include a first power interconnection VDD and a second power interconnection VSS, and gate line patterns GL extending in a direction such as the Y-direction may be disposed. The gate line patterns GL may include gate lines and dummy gate lines.

FIGS. 6A to 6D are views illustrating a process of correcting a layout of a semiconductor device according to some example embodiments.

In the layout of the semiconductor device illustrated in FIGS. 6A to 6D, patterns or layers corresponding to interconnections and vias will be omitted, and only active line patterns ACT1 and ACT2, a gate line pattern GL, and a gate contact pattern CB will be illustrated. A region indicated by a thickest line may be or may correspond to a region in which a filler cell is placed, and a region indicated by a second thicker line may be a region in which a standard cell is placed.

FIGS. 6A to 6D may be examples of a method of designing a layout of a semiconductor device, as illustrated in FIG. 4, and illustrate a process of correcting a first layout (e.g., L1A, L1B, L1C, and L1D) to form a second layout (e.g., L2A, L2B, L2C, and L2D). The first layout (e.g., L1A, L1B, L1C, and L1D) may be a layout of at least a portion of the semiconductor device formed in the layout forming operation (S20) of FIG. 1, and the second layout (e.g., L2A, L2B, L2C, and L2D) may be a layout of at least a portion of the semiconductor device formed in the layout correction operation (S30) of FIG. 1.

Figure 6A:
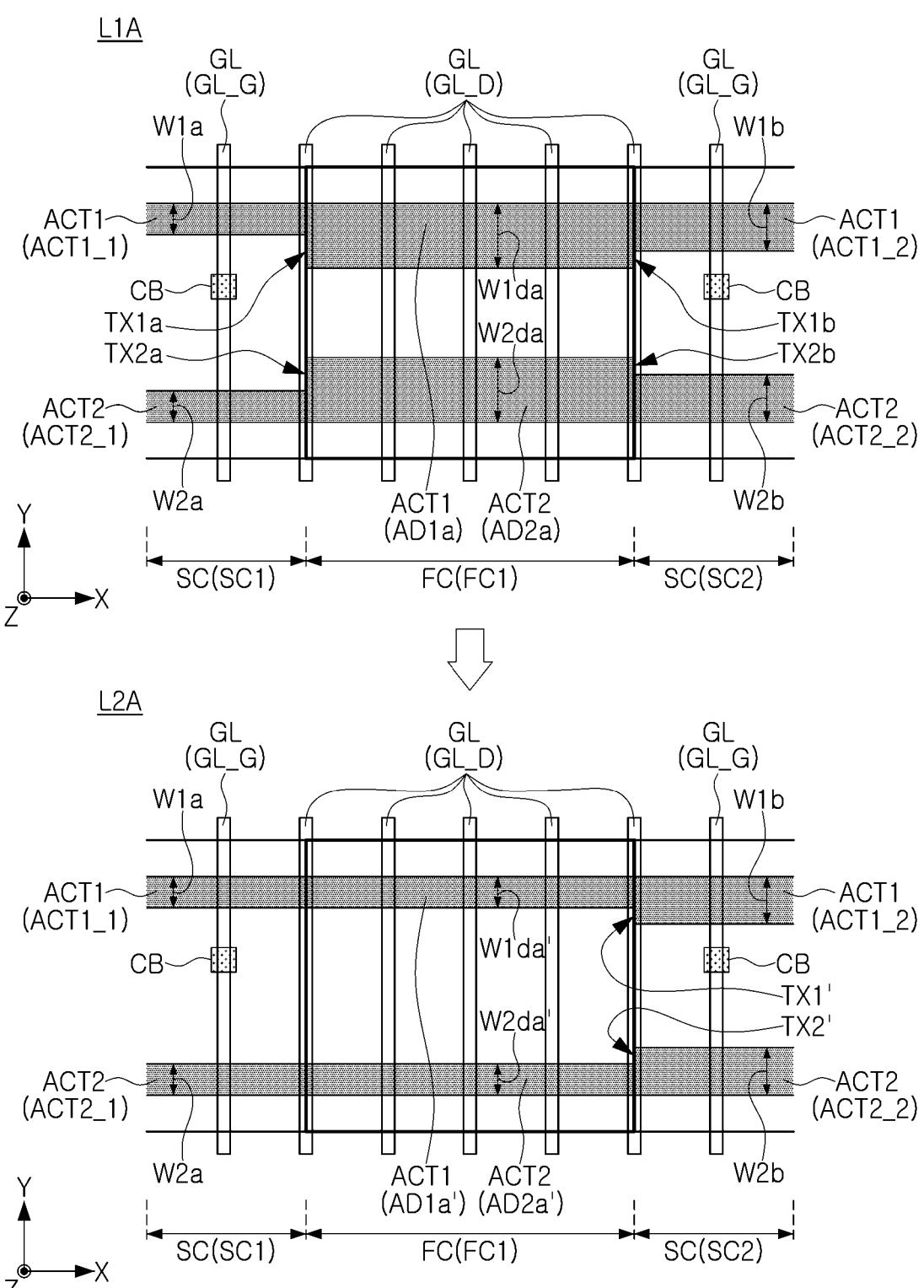
FIGS. 6A to 6D are views illustrating a process of correcting a layout of a semiconductor device according to some example embodiments.

Referring to FIG. 6A, a first layout L1A may include a first standard cell SC1, a second standard cell SC2, and a first filler cell FC1 arranged therebetween, and a width W1$a$ of a first active line ACT1_1 of the first standard cell SC1 may be narrower than a width W1$b$ of a first active line ACT1_2 of the second standard cell SC2, and a width W1$da$ of a first dummy active line AD1$a$ of the first filler cell FC1 may be wider than W1$a$ and W1$b$, respectively. Therefore, a first active line pattern ACT1 may include transition regions TX1$a$ and TX1$b$ formed near a boundary of the first filler cell FC1. The transition regions TX1$a$ and TX1$b$ may be disposed or arranged on dummy gate lines GL_D on the boundary of the first filler cell FC1, and may overlap the dummy gate lines GL_D. In addition, a width W2$a$ of a second active line ACT2_1 of the first standard cell SC1 may be narrower than a width W2$b$ of a second active line ACT2_2 of the second standard cell SC2, and a width W2$da$ of a second dummy active line AD2$a$ of the first filler cell FC1 may be wider than W2$a$ and W2$b$, respectively. Therefore, a second active line pattern ACT2 may include transition regions TX2$a$ and TX2$b$ formed near the boundary of the first filler cell FC1.

A second layout L2A may be a layout formed by or based on analyzing the transition regions TX1$a$, TX1$b$, TX2$a$, and TX2$b$ of the first layout L1A, selecting the first filler cell FC1 of the first layout L1A as a target filler cell, and correcting a pattern of the target filler cell. For example, in the first layout L1A, the width W1$da$ of the first dummy active line AD1$a$ of the first filler cell FC1, which may be or may correspond to the target filler cell, may be adjusted to be the same as the width of W1$a$, which may be a narrower width among W1$a$ and W1$b$. Therefore, in the second layout L2A, a first dummy active line AD1$a$' of the first filler cell FC1 may have a width W1$da$', the transition region TX1$a$ provided in the first layout L1A may disappear from or be reduced from the second layout L2A (a bent portion may not be formed), and a corrected transition region TX1' of the second layout L2A may face an inner space or a central portion of the first filler cell FC1. The corrected transition region TX1' may be disposed or arranged on the dummy gate lines GL_D on the boundary of the first filler cell FC1, and may overlap the dummy gate lines GL_D. A second dummy active line AD2$a$' of the first filler cell FC1 of the second layout L2A may have a width W2$da$', and the transition region TX2$a$ provided in the first layout L1A may disappear from the second layout L2A (a bent portion may not be formed), and a corrected transition region of TX2' of the second layout L2A may face the inner space or the central portion of the first filler cell FC1.

Figure 7A:
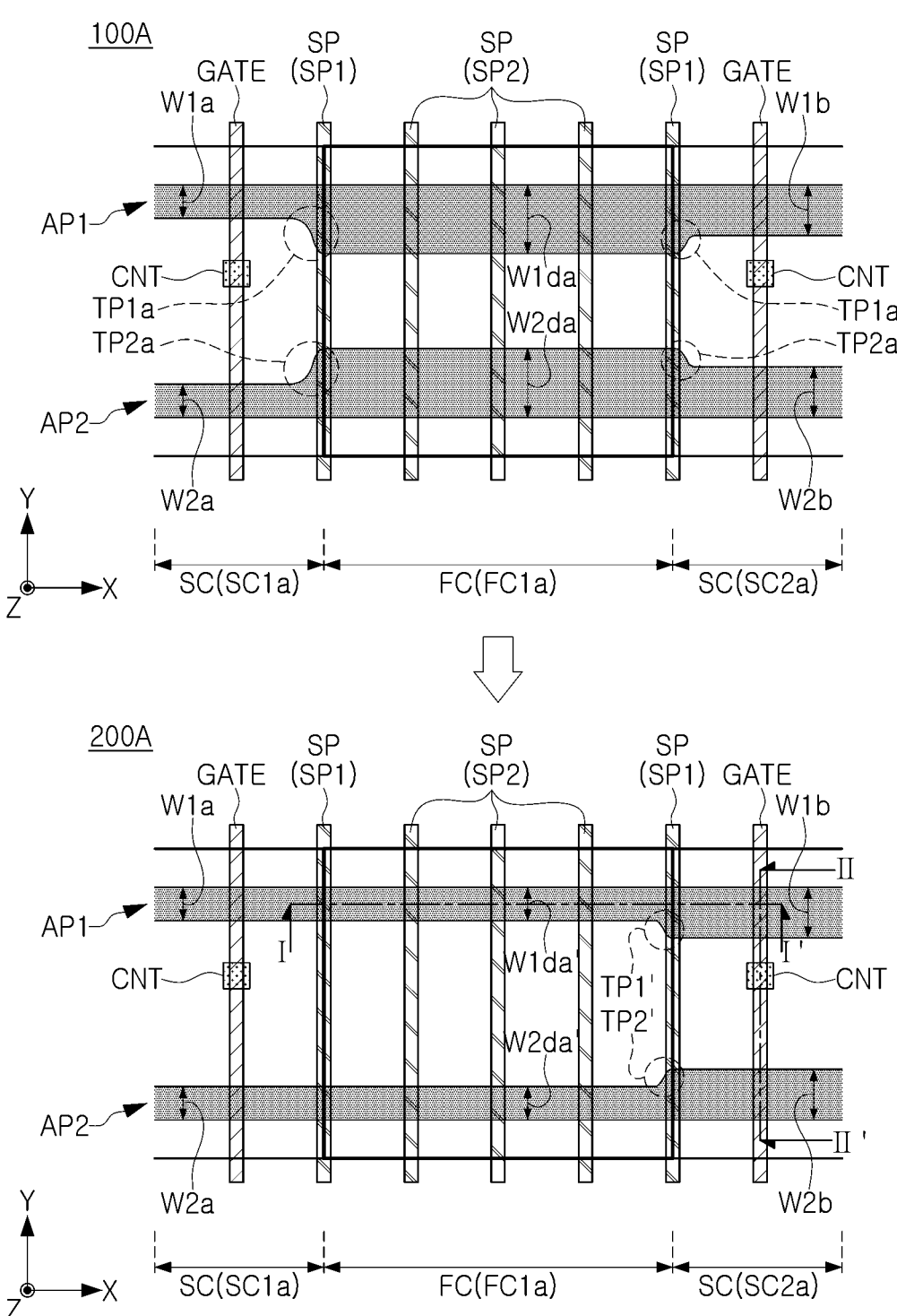
FIGS. 7A to 7D are views illustrating a process in which shapes of patterns formed on a substrate are changed as a layout of a semiconductor device is corrected according to some example embodiments.

The transition region of the first filler cell FC1 may be reduced or minimized by analyzing the first layout L1A and correcting the first filler cell FC1 to form the second layout L2A. The corrected transition regions TX1' and TX2' of the second layout L2A may face the inner space or the central portion of the first filler cell FC1. Referring to FIG. 7A together, inclined surfaces of tapered regions TP1' and TP2' respectively formed when the corrected transition regions TX1' and TX2' are transferred onto a substrate 101 through a mask may face the inner space of the first filler cells FC1. Therefore, a portion in which a width changes may not be formed in a first active pattern AP1 of a second standard cell SC2a corresponding to the first active line ACT1_2 of the second standard cell SC2. Therefore, characteristics of semiconductor devices disposed in a standard cell may be stably secured, and reliability thereof may be improved.

A contact pattern CB may be disposed on gate lines GL_G of standard cells SC, and the gate contact pattern CB may not be disposed on the dummy gate lines GL_D of a filler cell FC. Any one of the first active line pattern ACT1 and the second active line pattern ACT2 may be formed on an NWELL layout pattern.

Figure 6B:
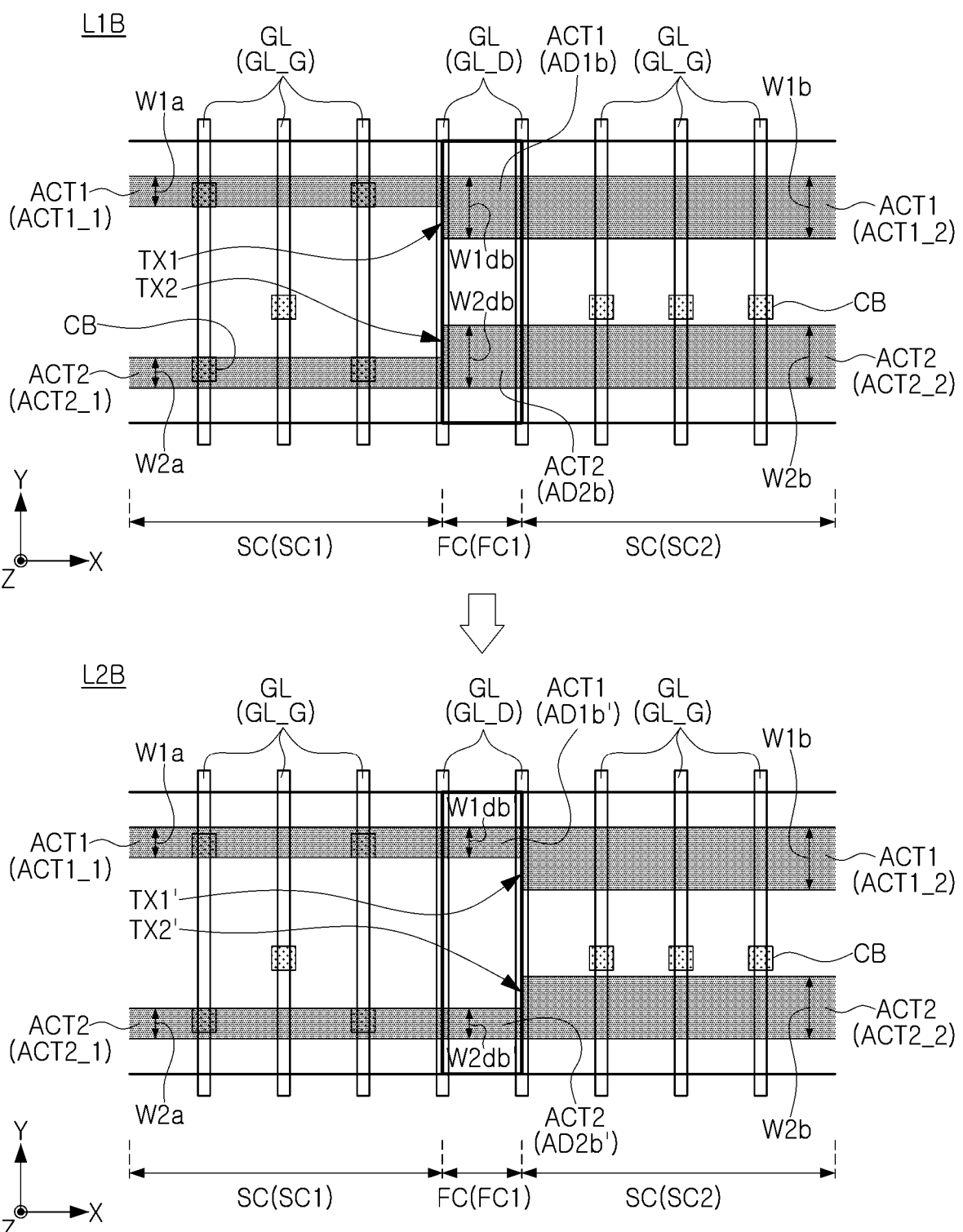

Referring to FIG. 6B, a first layout L1B may include a first standard cell SC1, a second standard cell SC2, and a first filler cell FC1 disposed therebetween, and a width W1a of a first active line ACT1_1 of the first standard cell SC1 may be narrower than a width W1b of a first active line ACT1_2 of the second standard cell SC2, and a width W1db of a first dummy active line AD1b of the first filler cell FC1 may be equal to W1b. Therefore, a first active line pattern ACT1 may include a transition region TX1 formed near a boundary of the first filler cell FC1. The transition region TX1 may be disposed on a dummy gate line GL_D on the boundary of the first filler cell FC1, and may overlap the dummy gate line GL_D. In addition, a width W2a of a second active line ACT2_1 of the first standard cell SC1 may be narrower than a width W2b of a second active line ACT2_2 of the second standard cell SC2, and a width W2db of a second dummy active line AD2b of the first filler cell FC1 may be equal to W2b. Therefore, a second active line pattern ACT2 may include a transition region TX2 formed near the boundary of the first filler cell FC1.

A second layout L2B may be a layout formed by analyzing the transition regions TX1 and TX2 of the first layout L1B, selecting the first filler cell FC1 of the first layout L1B as a target filler cell, and correcting a pattern of the target filler cell. For example, in the first layout L1B, the width W1db of the first dummy active line AD1b of the first filler cell FC1, which may be the target filler cell, may be adjusted to be the same as the width of W1a, which may be a narrower width among W1a and W1b. Therefore, in the second layout L2B, a first dummy active line AD1b' of the first filler cell FC1 may have a width W1db', the transition region TX1 provided in the first layout L1B may disappear from the second layout L2B, and a corrected transition region TX1' of the second layout L2B may face an inner space or a central portion of the first filler cell FC1. The corrected transition region TX1' may be disposed on the dummy gate line GL_D on the boundary of the first filler cell FC1, and may overlap the dummy gate line GL_D. A second dummy active line AD2b' of the first filler cell FC1 of the second layout L2B may have a width W2db', and the transition region TX2 provided in the first layout L1B may disappear from the second layout L2B, and a corrected transition region of TX2' of the second layout L2B may face the inner space or the central portion of the first filler cell FC1.

Figure 7B:
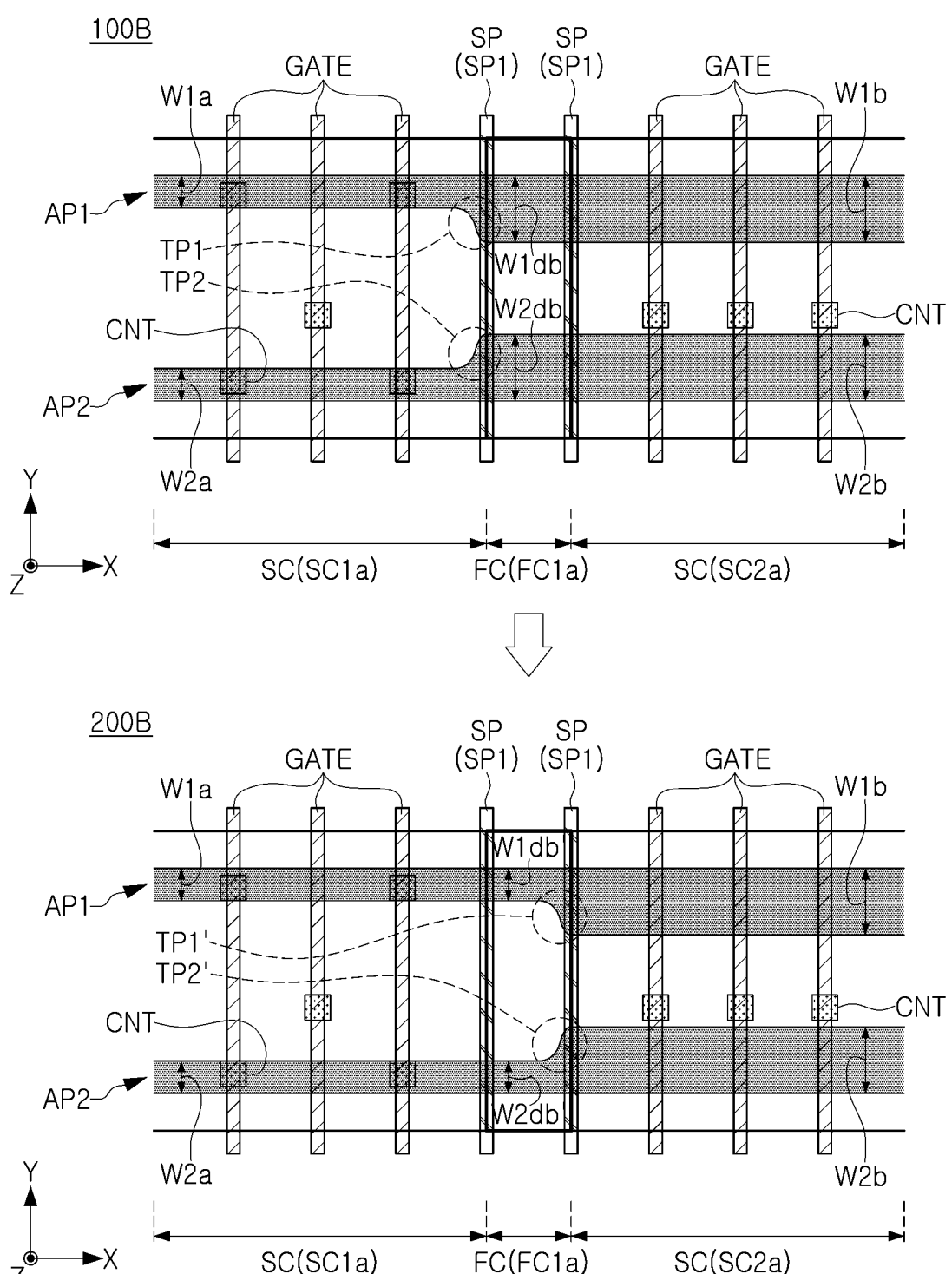

The transition region of the first filler cell FC1 may be minimized by analyzing the first layout L1B and correcting the first filler cell FC1 to form the second layout L2B. The corrected transition regions TX1' and TX2' of the second layout L2B may face the inner space or the central portion of the first filler cell FC1. Referring to FIG. 7B together, inclined surfaces of tapered regions TP1' and TP2' respectively formed when the corrected transition regions TX1' and TX2' are transferred onto a substrate 101 through a mask may face the inner space of the first filler cells FC1. Therefore, a portion in which a width changes may not be formed in a first active pattern AP1 of a second standard cell SC2a corresponding to the first active line ACT1_2 of the second standard cell SC2. Therefore, characteristics of semiconductor devices disposed in a standard cell may be stably secured, and reliability thereof may be improved.

Figure 6C:
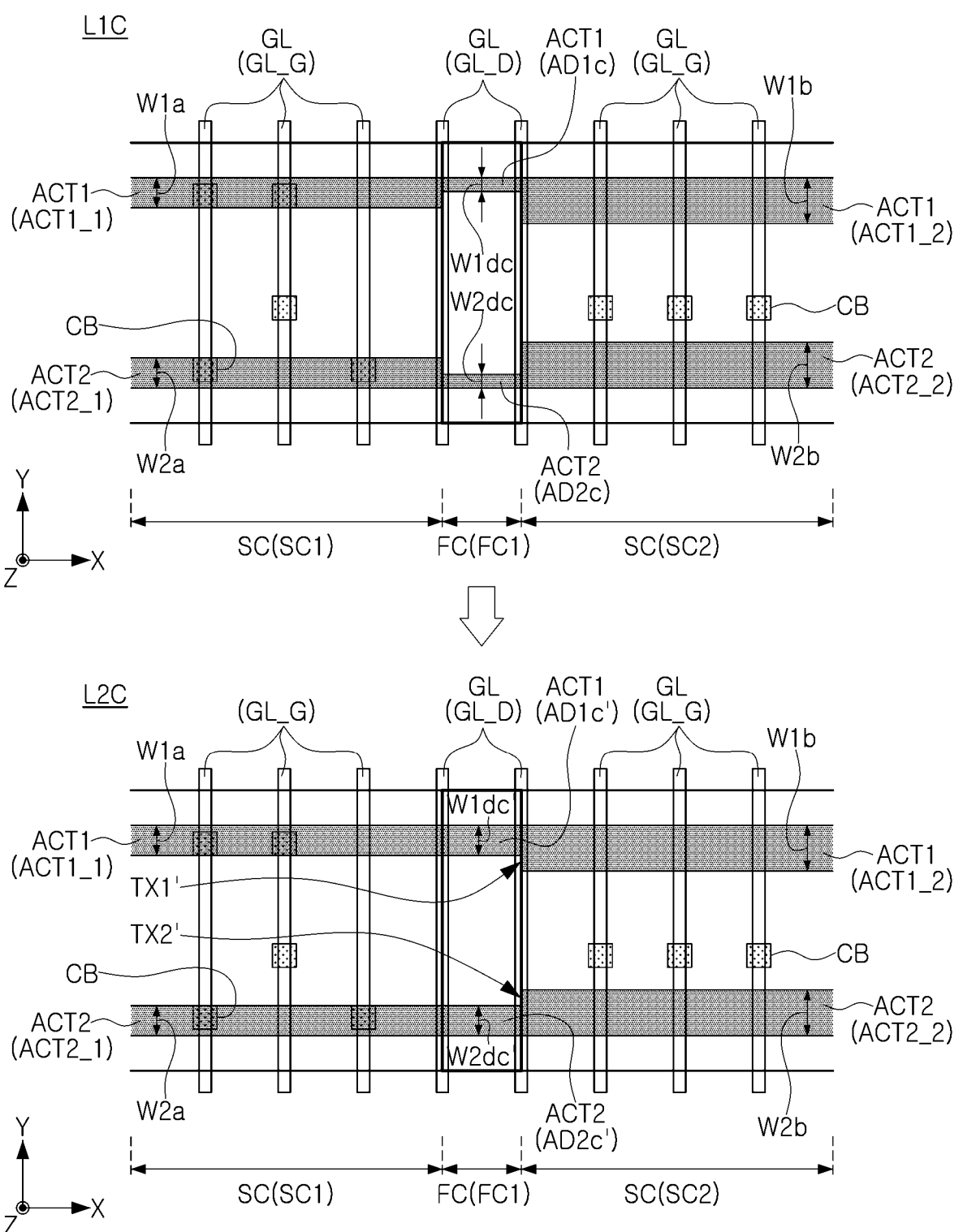

Referring to FIG. 6C, a first layout L1C may include a first standard cell SC1, a second standard cell SC2, and a first filler cell FC1 disposed therebetween, and a width W1a of a first active line ACT1_1 of the first standard cell SC1 may be narrower than a width W1b of a first active line ACT1_2 of the second standard cell SC2, and a width W1dc of a first dummy active line AD1a of the first filler cell FC1 may be narrower than W1a and W1b, respectively. Therefore, a first active line pattern ACT1 may include transition regions formed near a boundary of the first filler cell FC1. The transition regions may be disposed on dummy gate lines GL_D on the boundary of the first filler cell FC1, and may overlap the dummy gate lines GL_D. In addition, a width W2a of a second active line ACT2_1 of the first standard cell SC1 may be narrower than a width W2b of a second active line ACT2_2 of the second standard cell SC2, and a width W2dc of a second dummy active line AD2a of the first filler cell FC1 may be narrower than W2a and W2b, respectively. Therefore, a second active line pattern ACT2 may include transition regions formed near the boundary of the first filler cell FC1.

A second layout L2C may be a layout formed by analyzing the transition regions of the first layout L1C, selecting the first filler cell FC1 of the first layout L1C as a target filler cell, and correcting a pattern of the target filler cell. For example, in the first layout L1C, the width W1dc of the first dummy active line AD1c of the first filler cell FC1, which may be the target filler cell, may be adjusted to be the same as the width of W1a, which may be a narrower width among W1a and W1b. Therefore, in the second layout L2C, a first dummy active line AD1c' of the first filler cell FC1 may have a width W1dc', the transition region, due to a difference in width between W1a and W1dc, provided in the first layout L1C may disappear from the second layout L2C, and a corrected transition region TX1' of the second layout L2C may face an inner space or a central portion of the first filler cell FC1. The corrected transition region TX1' may be disposed on the dummy gate lines GL_D on the boundary of the first filler cell FC1, and may overlap the dummy gate lines GL_D. A second dummy active line AD2c' of the first filler cell FC1 of the second layout L2C may have a width W2dc', and the transition region, due to a difference in width between W2a and W2dc, provided in the first layout L1C may disappear from the second layout L2C, and a corrected transition region of TX2' of the second layout L2C may face the inner space or the central portion of the first filler cell FC1.

Figure 7C:
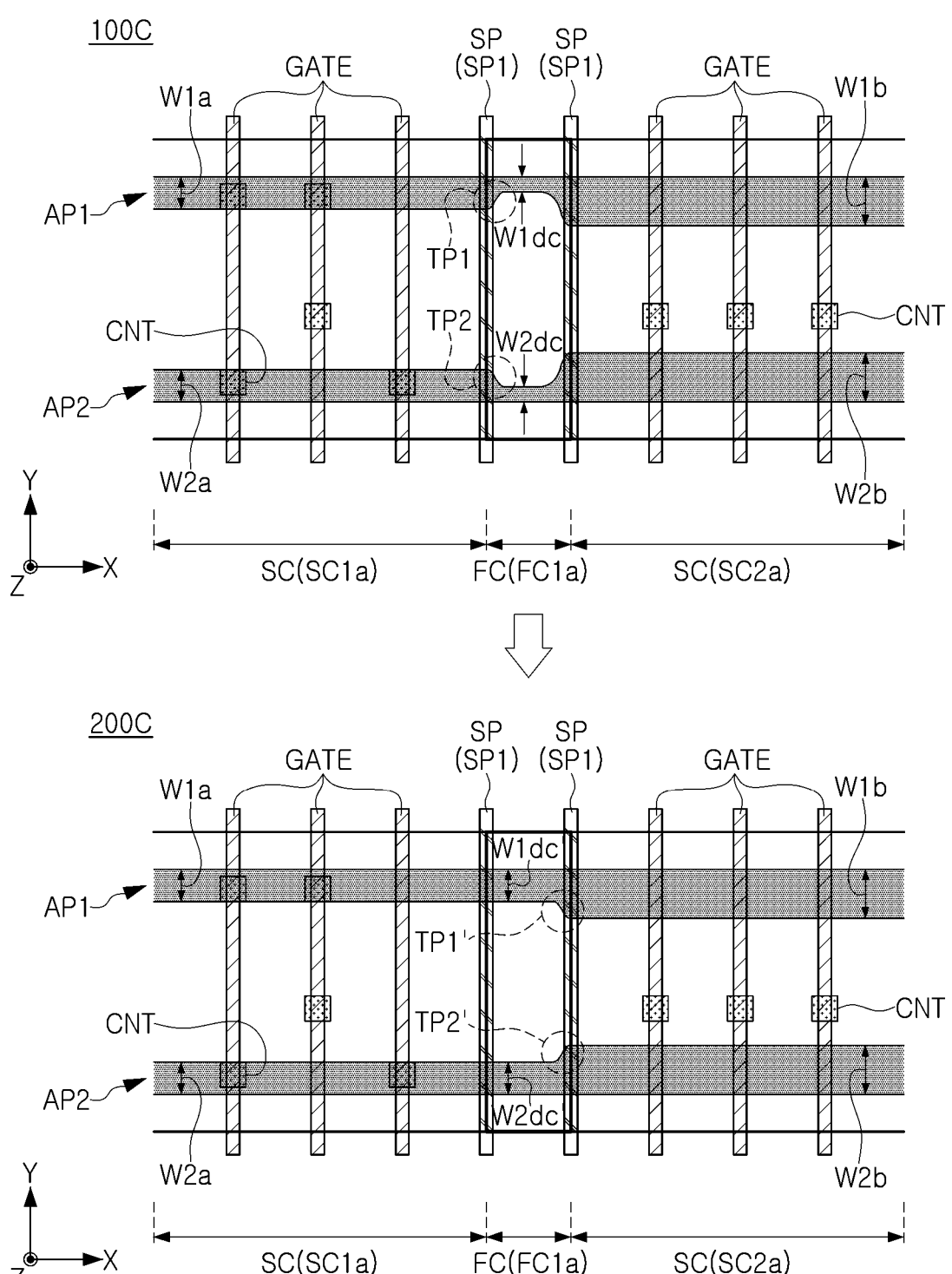

The transition region of the first filler cell FC1 may be minimized by analyzing the first layout L1C and correcting the first filler cell FC1 to form the second layout L2C. The corrected transition regions TX1' and TX2' of the second layout L2C may face the inner space or the central portion of the first filler cell FC1. Referring to FIG. 7C together, inclined surfaces of tapered regions TP1' and TP2' respectively formed when the corrected transition regions TX1' and TX2' are transferred onto a substrate 101 through a mask may face the inner space of the first filler cells FC1. Therefore, a portion in which a width changes may not be formed in a first active pattern AP1 of a second standard cell SC2a corresponding to the first active line ACT1_2 of the second standard cell SC2. Therefore, characteristics of semiconductor devices disposed in a standard cell may be stably secured, and reliability thereof may be improved.

Figure 6D:
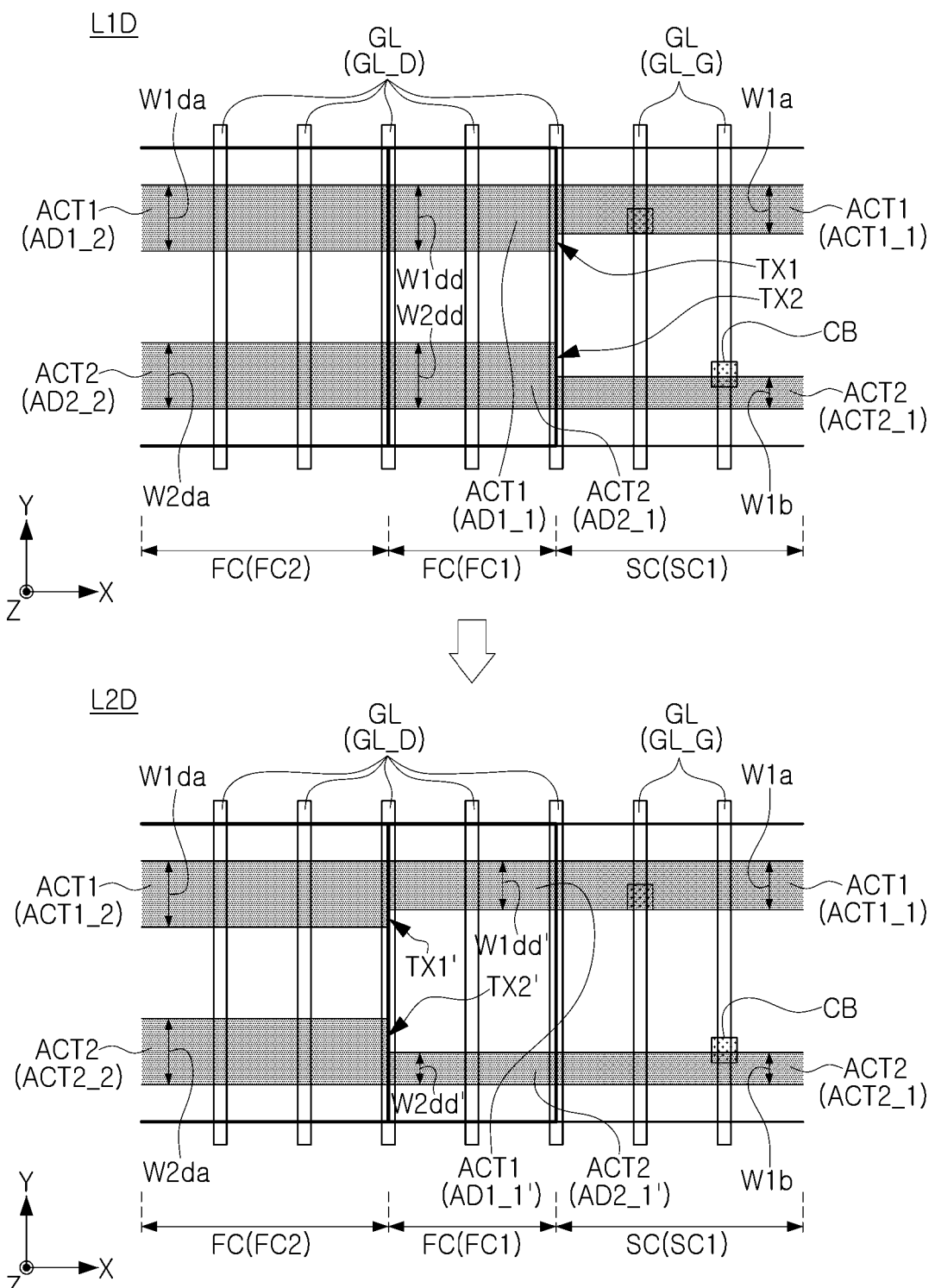

Referring to FIG. 6D, a first layout L1D may include a first filler cell FC1, a second filler cell FC2, and a first standard cell SC1, and a width W1a of a first active line ACT1_1 of the first standard cell SC1 may be narrower than a width W1da of a second dummy active line AD1_2 of the second filler cell FC2, and a width W1dd of a first dummy active line AD1_1 of the first filler cell FC1 may be equal to W1da. Therefore, a first active line pattern ACT1 may include a transition region TX1 formed near a boundary of the first filler cell FC1 and the first standard cell SC1. The transition region TX1 may be disposed on dummy gate lines GL_D on the boundary of the first filler cell FC1, and may overlap the dummy gate lines GL_D. In addition, a width W2dd of a second dummy active line AD2_1 of the first filler cell FC1 may be wider than a width W1b of a second active line ACT2_1 of the first standard cell SC1, and a width W2da of a second dummy active line AD2_2 of the second filler cell FC2. Therefore, a second active line pattern ACT2 may include transition regions TX2a and TX2b formed near the boundary of the first filler cell FC1.

A second layout L2D may be a layout formed by analyzing the transition regions TX1 and TX2 of the first layout L1D, selecting the first filler cell FC1 of the first layout L1D as a target filler cell, and correcting a pattern of the target filler cell. For example, in the first layout L1D, the width W1dd of the first dummy active line AD1_1 of the first filler cell FC1, which may be the target filler cell, may be adjusted to be the same as the width of W1a, which may be a narrower width among W1a and W1b. Therefore, in the second layout L2D, a first dummy active line AD1_1' of the first filler cell FC1 may have a width W1dd', the transition region TX1 provided in the first layout L1D may disappear from the second layout L2D, and a corrected transition region TX1' of the second layout L2D may face an inner space or a central portion of the first filler cell FC1. The corrected transition region TX1' may be disposed on the dummy gate line GL_D on the boundary of the first filler cell FC1, and may overlap the dummy gate line GL_D. A second dummy active line AD2_1' of the first filler cell FC1 of the second layout L2D may have a width W2dd', and the transition region TX2 provided in the first layout L1D may disappear from the second layout L2B, and a corrected transition region of TX2' of the second layout L2D may face the inner space or the central portion of the first filler cell FC1.

Figure 7D:
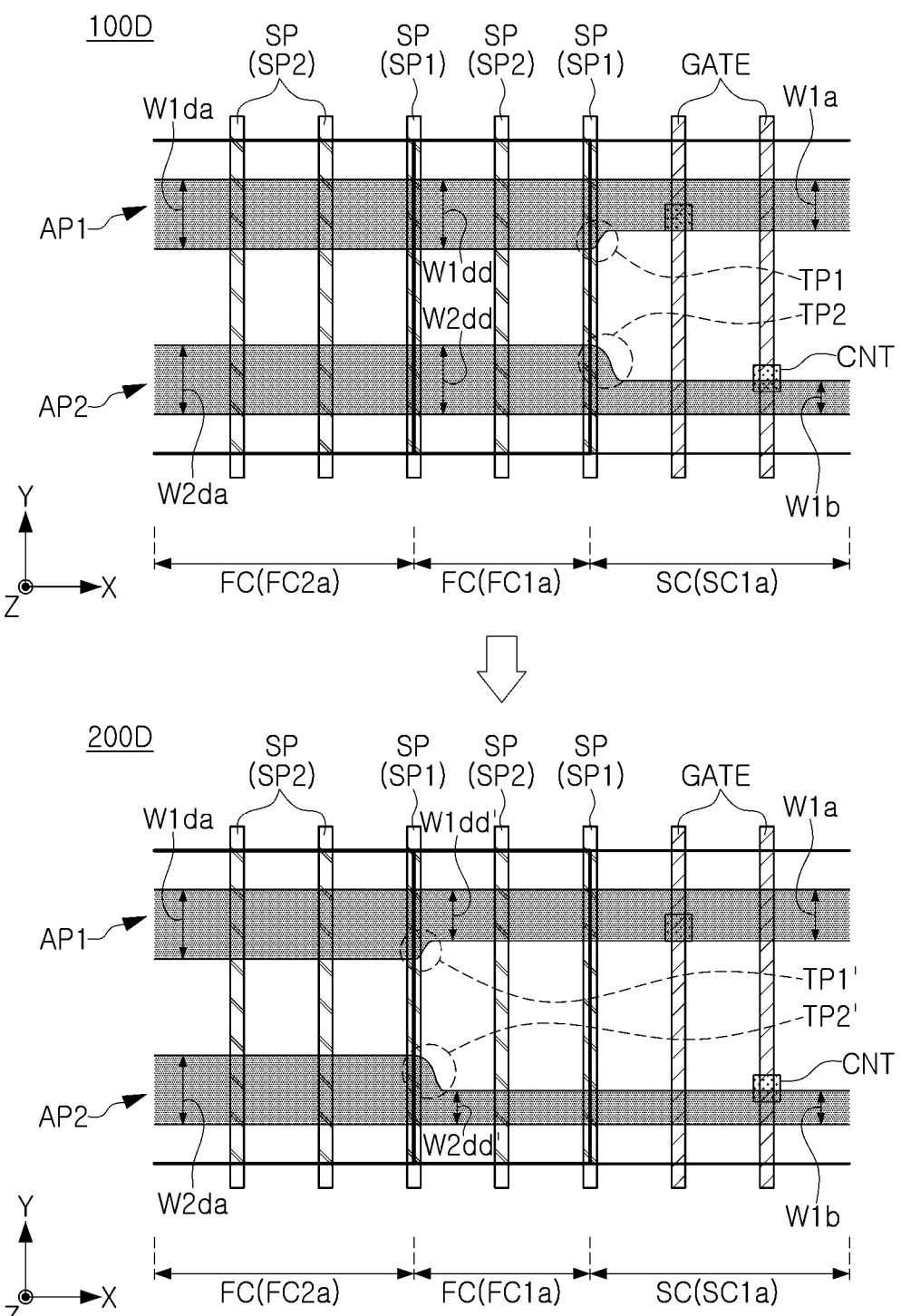

The transition region of the first filler cell FC1 may be minimized by analyzing the first layout L1D and correcting the first filler cell FC1 to form the second layout L2D. The corrected transition regions TX1' and TX2' of the second layout L2D may face the inner space or the central portion of the first filler cell FC1. Referring to FIG. 7D together, inclined surfaces of tapered regions TP1' and TP2' respectively formed when the corrected transition regions TX1' and TX2' are transferred onto a substrate 101 through a mask may face the inner space of the first filler cells FC1. Therefore, a portion in which a width changes may not be formed in a first active pattern AP1 of a first standard cell SC1a corresponding to the first active line ACT1_1 of the first standard cell SC1. Therefore, characteristics of semiconductor devices disposed in a standard cell may be stably secured, and reliability thereof may be improved.

FIGS. 7A to 7D are views illustrating a process in which shapes of patterns formed on a substrate are changed as a layout of a semiconductor device is corrected according to some example embodiments.

In the layout of the semiconductor device illustrated in FIGS. 7A to 7D, patterns or layers corresponding to interconnections and vias will be omitted, and only active patterns AP1 and AP2, a gate structure GATE, a dummy gate structure SP, and a gate contact structure CNT will be illustrated.

FIGS. 7A to 7D may be plan views illustrating first semiconductor devices 100A, 100B, 100C, and 100D and second semiconductor devices 200A, 200B, 200C, and 200D, formed using a first layout (e.g., L1A, L1B, L1C, and L1D) and a second layout (e.g., L2A, L2B, L2C, and L2D).

Referring to FIGS. 7A to 7D, the standard cells SC and the filler cells FC in the layouts of FIGS. 6A to 6D may be formed by reflecting the semiconductor device forming operation (S50 of FIG. 1) into a semiconductor device. For example, in FIG. 6A, the standard cells SC1 and SC2 of the layouts L1A and L2A may be formed as device regions SC1a and SC2a by the semiconductor device forming operation (S50 in FIG. 1), respectively, and the first filler cell FC1 of the layouts L1A and L2A may be formed as a dummy region FC1a by the semiconductor device forming operation (S50 of FIG. 1).

For example, active patterns AP1 and AP2 to which the active line patterns ACT1 and ACT2 of the layout of FIG. 6A are respectively reflected may be arranged as illustrated in FIG. 7A, and gate structures GATE to which the gate lines GL_G of FIG. 6A are reflected, and dummy gate structures SP to which the dummy gate lines GL_D of FIG. 6A are reflected may be arranged as illustrated in FIG. 7A.

The transition regions of the layout of FIGS. 6A to 6D may be reflected in the semiconductor device by the semiconductor device forming operation (S50 in FIG. 1), to form tapered regions TP1' and TP2' of the active patterns AP1 and AP2 of FIGS. 7A to 7D. When the semiconductor device is viewed in plan view, the tapered regions TP1' and TP2' may correspond to portions to be bent by a difference in width between the active patterns AP1 and AP2, and may have an inclined surface, respectively. The inclined surface may face an inner space of the dummy region FC1a. The tapered regions TP1' and TP2' may be regions of which widths continuously change in plan view.

Referring to FIG. 7A, in a first semiconductor device 100A, a first active pattern AP1 may have a width W1a in a first device region SC1a, a width W1b, wider than W1a, in a second device region SC2a, and a width W1da, wider than W1a and W1b, respectively, in a dummy region FC1a. As a layout is corrected by the method of FIG. 4, in a second semiconductor device 200A, a first active pattern AP1 may have a width W1da', equal to W1a, in a dummy region FC1a, and a first tapered region TP1' may be formed near a first boundary between the dummy region FC1a and a second device region SC2a. A central portion of the first tapered region TP1' may be shifted from a central axis of a first dummy gate pattern SP1 on the first boundary in a direction away from the first boundary. At least portion of the first tapered region TP1' may overlap the first dummy gate pattern SP1.

Referring to FIG. 7B, in a first semiconductor device 100B, a first active pattern AP1 may have a width W1a in a first device region SC1a, a width W1b, wider than W1a, in a second device region SC2a, and a width W1db, equal to W1b, in a dummy region FC1a. As a layout is corrected by the method of FIG. 4, in a second semiconductor device 200B, a first active pattern AP1 may have a width W1$db'$, equal to W1$a$, in a dummy region FC1$a$, and a first tapered region TP1' may be formed near a first boundary between the dummy region FC1$a$ and a second device region SC2$a$. A central portion of the first tapered region TP1' may be shifted from a central axis of a first dummy gate pattern SP1 on the first boundary in a direction away from the first boundary. At least a portion of the first tapered region TP1' may overlap the first dummy gate pattern SP1.

Referring to FIG. 7C, in a first semiconductor device 100C, a first active pattern AP1 may have a width W1$a$ in a first device region SC1$a$, a width W1$b$, wider than W1$a$, in a second device region SC2$a$, and a width W1$dc$, narrower than W1$a$ and W1$b$, respectively, in a dummy region FC1$a$. As a layout is corrected by the method of FIG. 4, in a second semiconductor device 200C, a first active pattern AP1 may have a width W1$dc'$, equal to W1$a$, in a dummy region FC1$a$, and a first tapered region TP1' may be formed near a first boundary between the dummy region FC1$a$ and a second device region SC2$a$. A central portion of the first tapered region TP1' may be shifted from a central axis of a first dummy gate pattern SP1 on the first boundary in a direction away from the first boundary. At least a portion of the first tapered region TP1' may overlap the first dummy gate pattern SP1.

Referring to FIG. 7D, in a first semiconductor device 100D, a first active pattern AP1 may have a width W1$a$ in a first device region SC1$a$, a width Wldd, wider than W1$a$, in a first dummy region FC1$a$, and a width W1$da$, equal to Wldd, in a second dummy region FC2$a$. As a layout is corrected by the method of FIG. 4, in a second semiconductor device 200D, a first active pattern AP1 may have a width Wldd', equal to W1$a$, in a first dummy region FC1$a$, and a first tapered region TP1' may be formed near a first boundary between the first dummy region FC1$a$ and the second dummy region FC2$a$. A central portion of the first tapered region TP1' may be shifted from a central axis of a first dummy gate pattern SP1 on the first boundary in a direction away from the first boundary. At least a portion of the first tapered region TP1' may overlap the first dummy gate pattern SP1.

FIGS. 8A and 8B are cross-sectional views illustrating semiconductor devices according to some example embodiments. FIG. 8A is a cross-sectional view of the semiconductor device 200A of FIG. 7A, taken along line I-I', and FIG. 8B is a cross-sectional view of the semiconductor device 200A of FIG. 7A, taken along line II-IF.

The semiconductor device 200A may include a substrate 101, an active pattern AP on the substrate 101, a device isolation layer 110 on a side surface of the active pattern AP, a gate structure GATE and a dummy gate structure SP, extending to intersect the active pattern AP, source/drain regions SD disposed on a recessed region of the active pattern AP on both sides of the gate structure GATE and both sides of the dummy gate structure SP, a contact structure CNT_SD connected to the source/drain regions SD, and a gate contact structure CNT on the gate structure GATE. The semiconductor device 200A may further include an interconnection structure including a plurality of interconnections and a plurality of vias, disposed on the gate structure GATE.

The semiconductor device 200A may further include channel layers 140 disposed on the active pattern AP in a region intersecting the gate structure GATE, and in which channels of a transistor are formed. The active pattern AP may have a fin structure, and a gate electrode 136 of the gate structure GATE may be disposed between the active pattern AP and a lower channel layer 140, between the channel layers 140, and on an upper channel layer 140. Therefore, the semiconductor device 200A may include a multi-bridge channel FET (MBCFET™) formed of the channel layers 140, the source/drain regions SD, and the gate structure GATE.

The active pattern AP may correspond to the active line pattern ACT of the second layout of FIG. 6A, and the gate structure GATE may correspond to the gate line GL_G of the second layout of FIG. 6A.

The substrate 101 may include a semiconductor material, such as one or more of a group IV semiconductor, a group III-V compound semiconductor, or a group II-VI compound semiconductor. For example, the group IV semiconductor may include silicon, germanium, or silicon-germanium. The substrate 101 may be a bulk wafer, an epitaxial layer, a silicon-on-insulator (SOI) layer, a semiconductor-on-insulator (SeOI) layer, or the like. The substrate 101 may include doped regions such as an N-well region NWELL. Active patterns formed on the N-well region NWELL may have an N-type conductivity, and active patterns not disposed on the N-well region NWELL may have a P-type conductivity.

The device isolation layer 110 may define the active patterns AP in the substrate 101. The device isolation layer 110 may be formed by, for example, a shallow trench isolation (STI) process. According to some example embodiments, the device isolation layer 110 may have a curved upper surface having a level increased in a direction toward active fins. The device isolation layer 110 may be formed of an insulating material, and may include, for example, an oxide, a nitride, or a combination thereof.

The active patterns AP may be defined by the device isolation layer 110 in the substrate 101, and may extend in the X-direction. The active patterns AP may have a shape protruding from the substrate 101. Upper ends of the active patterns AP may be disposed to protrude from an upper surface of the device isolation layer 110 to a predetermined height. The active patterns AP may be provided as a portion of the substrate 101, and/or may include an epitaxial layer grown from the substrate 101. A portion of the active patterns AP may be recessed on both sides of the gate structures GATE, and the source/drain regions SD may be disposed on the recessed active patterns AP. According to embodiments, the active patterns AP may have doped regions including impurities. For example, the active patterns AP may include impurities that may be diffused from the source/drain regions SD in a region in contact with the source/drain regions SD.

The source/drain regions SD may be disposed on the active pattern AP on at least one side of the gate structure GATE. The source/drain regions SD may serve as a source region or a drain region of the transistor. The source/drain regions SD may have angular side surfaces in a cross-section in the Y-direction of FIG. 8B. In some example embodiments, the source/drain regions SD may have various shapes, for example, one of polygonal, circular, elliptical, and rectangular shapes.

The source/drain regions SD may be formed of a semiconductor material. For example, the source/drain regions SD may include at least one of silicon (Si), silicon germanium (SiGe), silicon arsenic (SiAs), silicon phosphide (SiP), or silicon carbide (SiC). For example, the source/drain regions SD may include N-type doped silicon (Si) and/or P-type doped silicon germanium (SiGe). In some example embodiments, the source/drain regions SD may include a plurality of regions including elements having different concentrations and/or doping elements.

The gate structures GATE may be disposed to intersect the active patterns AP and to extend in one direction, for example, the Y-direction. The gate structures GATE may include a gate insulating layer 132, gate spacer layers 134, a gate electrode 136, and a gate capping layer 138, respectively.

The gate insulating layer 132 may be disposed between the active pattern AP and the gate electrode 136. In various example embodiments, the gate insulating layer 132 may include a plurality of layers, or may be disposed to extend toward a side surface of the gate electrode 136. The gate insulating layer 132 may include an oxide, a nitride, or a high-k dielectric material. The high-k dielectric material may refer to a dielectric material having a dielectric constant, greater than that of a silicon oxide ($SiO_2$) layer.

The gate electrode 136 may include a conductive material, for example, at least one of W, Ti, Ta, Mo, TiN, TaN, WN, TiON, TiAlC, TiAlN, or TaAlC. The gate electrode 136 may include a semiconductor material such as doped poly-silicon. The gate electrode 136 may include two or more multiple layers. The gate electrodes 136 may be separated from each other in the Y-direction between at least some adjacent transistors, depending on a circuit configuration of the semiconductor device 200A. For example, the gate electrode 136 may be separated by an additional gate separation layer.

The gate spacer layers 134 may be disposed on both side surfaces of the gate electrode 136. The gate spacer layers 134 may insulate the source/drain regions SD from the gate electrode 136. The gate spacer layers 134 may have a multi-layer structure according to embodiments. The gate spacer layers 134 may be formed of a silicon oxide, a silicon nitride, or a silicon oxynitride, and, in particular, a low-k dielectric material. The gate spacer layers 134 may include, for example, at least one of SiO, SiN, SiCN, SiOC, SiON, or SiOCN. An inner spacer layers 120 may be disposed between the channel layers 140 and between a lowermost channel layer 140 and the active pattern AP, in parallel with the gate electrode 136.

The gate capping layer 138 may be disposed on an upper surface of the gate electrode 136, and lower and side surfaces of the gate capping layer 138 may be surrounded by the gate electrode 136 and the gate spacer layers 134, respectively. The gate capping layer 138 may be formed of, for example, a silicon oxide, a silicon nitride, a silicon oxynitride, or combinations thereof.

The contact structure CNT_SD may be connected to the source/drain regions SD to apply an electrical signal or supply power to the source/drain regions SD. The contact structure CNT_SD may pass through an interlayer insulating layer 160 to contact the source/drain regions SD. The contact structure CNT_SD may be disposed to recess a portion of the source/drain regions SD. The contact structure CNT_SD may be disposed to be elongated in the Y-direction. For example, the contact structure CNT_SD may have a linear shape or a bar shape having a length greater in the Y-direction than in the X-direction. The contact structure CNT_SD may have an inclined side surface of which an upper width is narrower than a lower width depending on an aspect ratio, but inventive concepts is not limited thereto. The contact structure CNT_SD may include at least one of, for example, titanium nitride (TiN), tantalum nitride (TaN), tungsten nitride (WN), tungsten carbon nitride (WCN), titanium (Ti), tantalum (Ta), tungsten (W), copper (Cu), aluminum (Al), cobalt (Co), ruthenium (Ru), or molybdenum (Mo). A metal-semiconductor compound layer, formed of a material such as one or more of metal silicide, metal germanide, or metal silicide-germanide, may be further disposed between the contact structure CNT_SD and the source/drain regions SD.

The gate contact structure CNT may be disposed on the gate structure GATE, and may not be disposed on the dummy gate structure SP. The gate contact structure CNT may pass through the gate capping layer 138 to be connected to the gate electrode 136.

Figure 9:
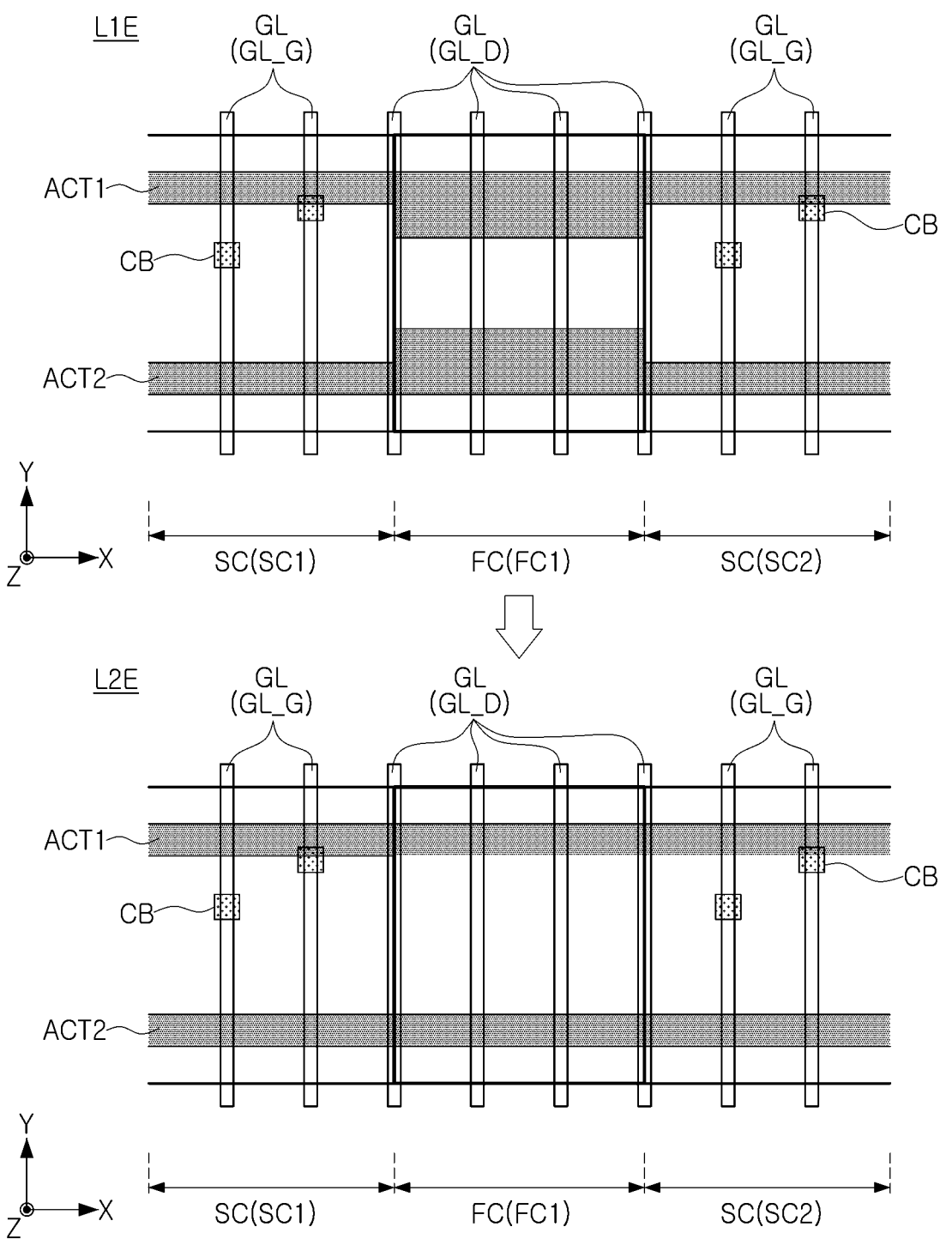
FIGS. 9 to 11 are views illustrating a process of correcting a layout of a semiconductor device according to some example embodiments.
Figure 10:
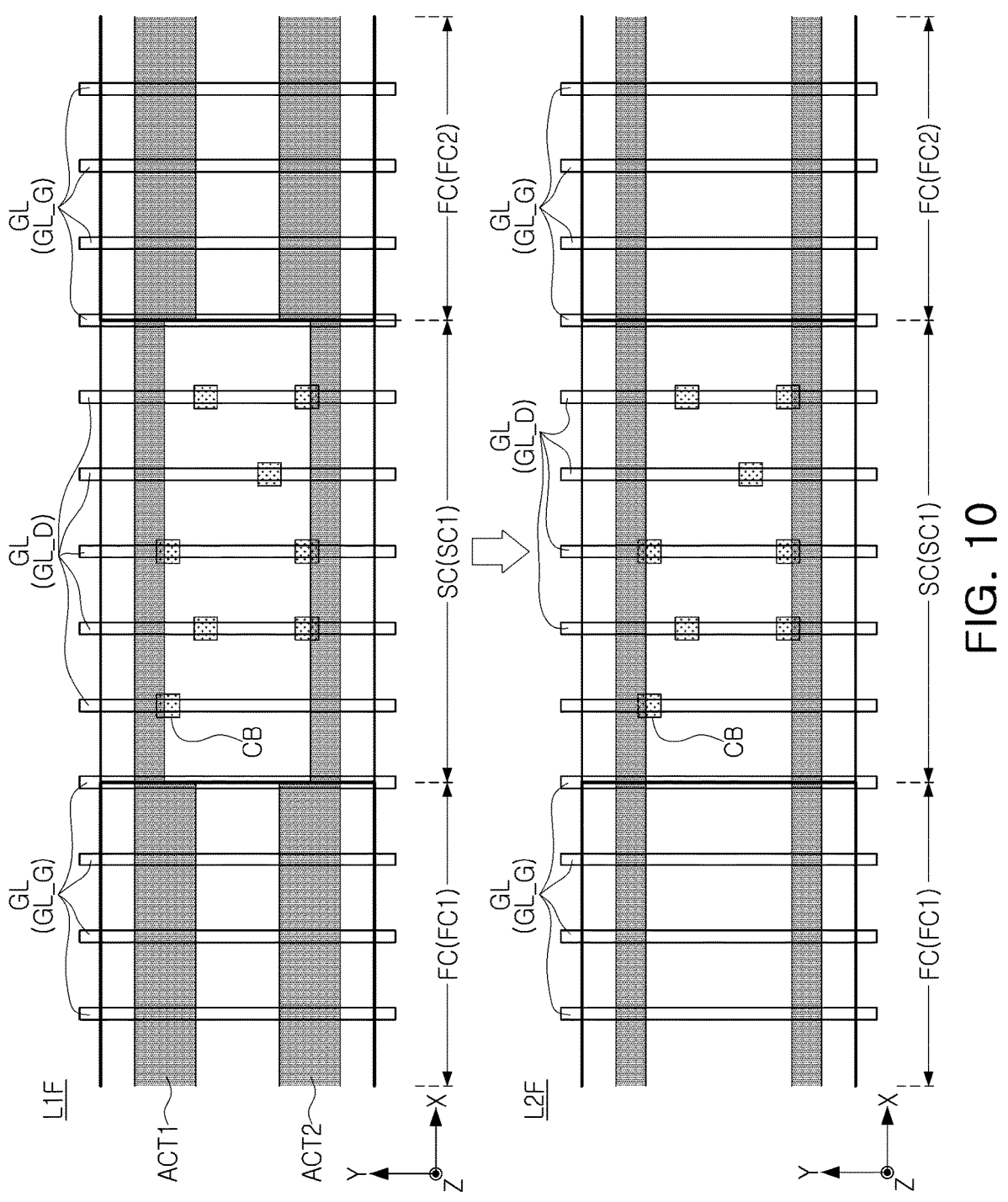
Figure 11:
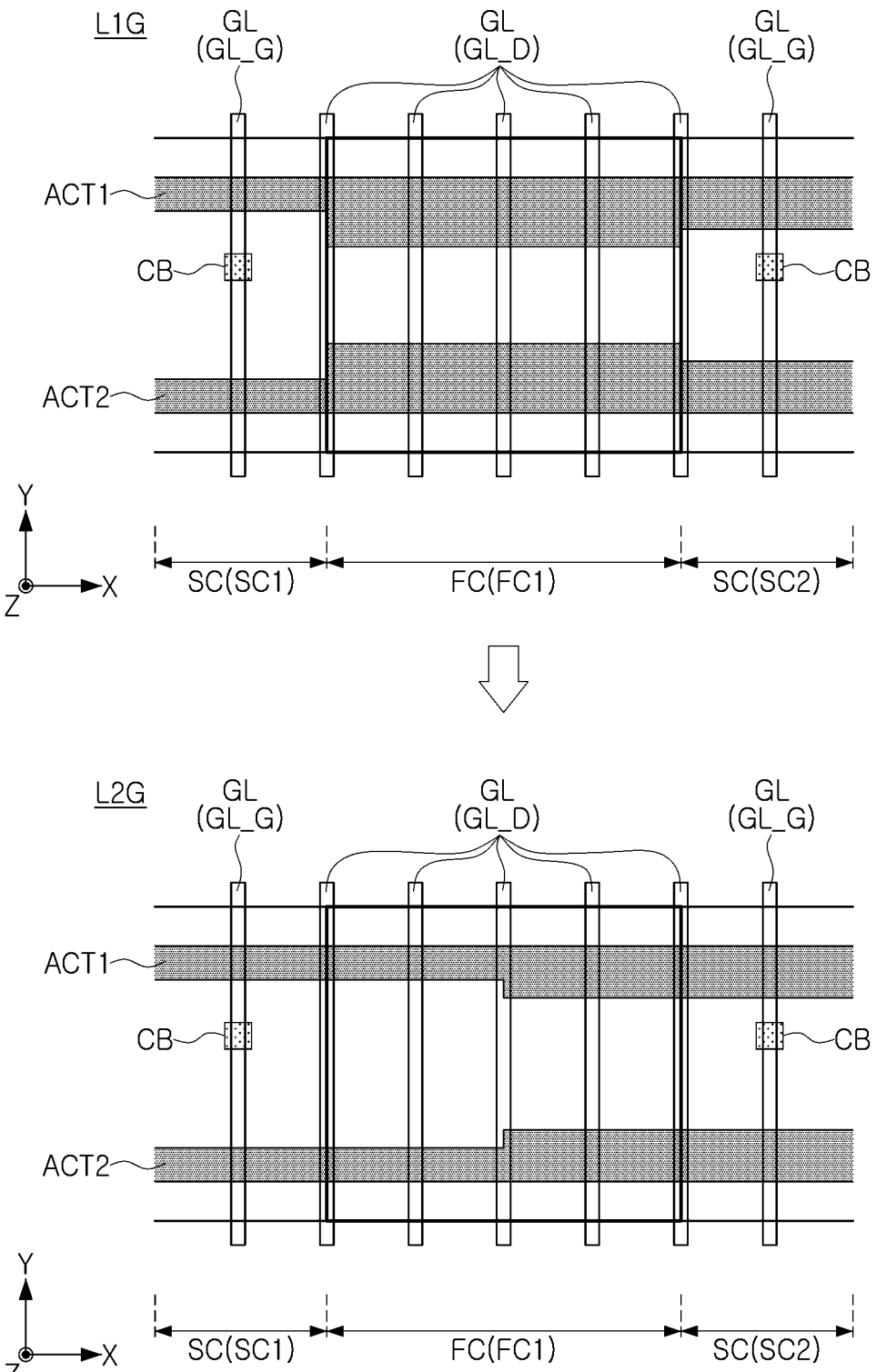

FIGS. 9 to 11 are views illustrating a process of correcting a layout of a semiconductor device according to various example embodiments.

Referring to FIG. 9, a first layout LW may include a first standard cell SC1, a second standard cell SC2, and a first filler cell FC1 disposed therebetween, and a width of a dummy active line of a first active line pattern ACT1 disposed in the first filler cell FC1 may be narrower than a width of an active line of a first active line pattern ACT1 respectively disposed in the standard cells SC1 and SC2. Therefore, transition regions due to a difference in width may be formed near a boundary of the first filler cell FC1. After analyzing the first layout L1E, the width of the dummy active line of the first filler cell FC1 may be corrected to have a narrower width, among widths of the active lines of other neighboring standard cells, to form a second layout L2E. As illustrated in FIG. 9, in the second layout L2E, the transition regions may disappear.

Referring to FIG. 10, a first layout L1F may include a first filler cell FC1, a second filler cell FC2, and a first standard cell SC1 disposed therebetween, and a width of an active line of a first active line pattern ACT1 disposed in the first standard cell SC1 may be narrower than a width of a dummy active line of a first active line pattern ACT1 respectively disposed in the filler cells FC1 and FC2. Therefore, transition regions due to a difference in width may be formed near a boundary of the first standard cell SC1. After analyzing the first layout L1F, the width of each of the dummy active lines disposed in the first and second filler cells FC1 and FC2 may be corrected or at least partially revised to have a width, equal to a width of an active line of a neighboring first standard cell SC1, to form a second layout L2F. As illustrated in FIG. 10, in the second layout L2F, the transition regions may disappear.

Referring to FIG. 11, a first layout L1G may include a first standard cell SC1, a second standard cell SC2, and a first filler cell FC1 disposed therebetween, and a width of a dummy active line of a first active line pattern ACT1 disposed in the first filler cell FC1 may be wider than a width of an active line of a first active line pattern ACT1 respectively disposed in the standard cells SC1 and SC2. Therefore, transition regions or step regions due to a difference in width may be formed near a boundary of the first filler cell FC1. The width of the active line of the first standard cell SC1 may be narrower than the width of the active line of the second standard cell SC2. After analyzing the first layout L1G, a design of the dummy active line of the first filler cell FC1 may be corrected. As illustrated in FIG. 11, in the second layout L2G, the dummy active line of the first active line pattern ACT1 may be corrected, to have a first portion having the same width as that of the active line of the first standard cell SC1, and a second portion having the same width as that of the active line of the second standard cell SC2. Therefore, since a transition region due to a difference between a width of the first portion and a width of the second portion may be disposed in an inner region of the first filler cell FC1 to be spaced away from the standard cells SC1 and SC2, characteristics of semiconductor devices disposed in the standard cell may be more likely to be stably secured.

Figure 12:
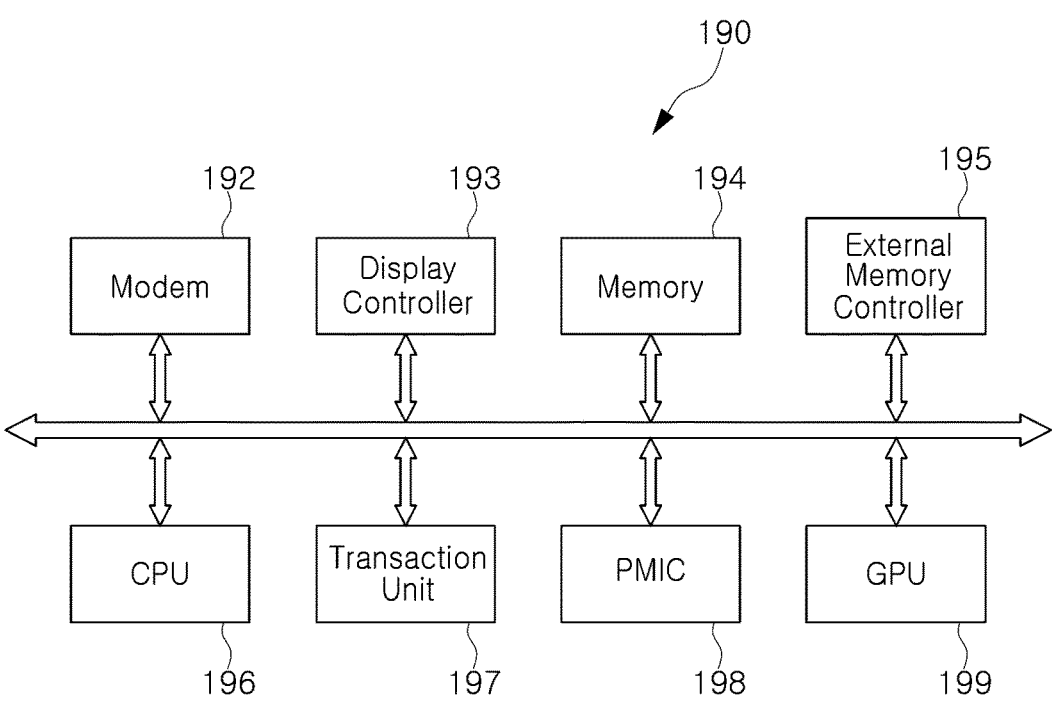
FIG. 12 is a block diagram illustrating a system-on-chip (SoC) according to some example embodiments.

FIG. 12 is a block diagram illustrating a system-on-chip (SoC) according to some example embodiments.

Referring to FIG. 12, a SoC 190 may be a semiconductor device, and may include an integrated circuit according to an example embodiment of inventive concepts. The SoC 190 may implement complex functional blocks such as intellectual property (IP) that perform various functions in a single chip, and standard cells according to some example embodiments of inventive concepts may be included in each functional block of the SoC 190. Therefore, the SoC 190 may provide improved space efficiency and proven performance.

The SoC 190 may include a modem 192, a display controller 193, a memory 194, an external memory controller 195, a central processing unit (CPU) 196, a transaction unit 197, a PMIC 198, and a graphic processing unit (GPU) 199, and functional blocks of the SoC 190 may communicate with each other through a system bus 191.

The CPU 196, which may control an overall operation of the SoC 190, may control operations of the functional blocks 192, 193, 194, 195, 197, 198, and 199. The modem 192 may demodulate a signal received from an outside of the SoC 190, and/or may modulate a signal generated from an inside of the SoC 190 to transmit the same externally. The external memory controller 195 may control an operation of transmitting and receiving data from an external memory device connected to the SoC 190. For example, a program and/or data stored in the external memory device may be provided to the CPU 196 or the GPU 199 under control of the external memory controller 195. The GPU 199 may execute program instructions related to graphics processing. The GPU 199 may receive graphic data through the external memory controller 195, and may transmit graphic data processed by the GPU 199 to the outside of the SoC 190 through the external memory controller 195. The transaction unit 197 may monitor data transaction of each of the functional blocks, and the PMIC 198 may control power supplied to each of the functional blocks according to control of the transaction unit 197. The display controller 193 may control a display (or a display device), which may be in the outside of the SoC 190, to transmit data generated from the inside of the SoC 190 to the display.

The memory 194 may include one or more of an electrically erasable programmable read-only memory (EE-PROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like, as a non-volatile memory, and may include a dynamic random access memory (DRAM), a static random access memory (SRAM), a mobile DRAM, a double data rate synchronous dynamic random access memory (DDR SDRAM), a low power DDR (LPDDR) SDRAM, a graphic DDR (GDDR) SDRAM, a Rambus dynamic random access memory (RDRAM), or the like, as a volatile memory.

Figure 13:
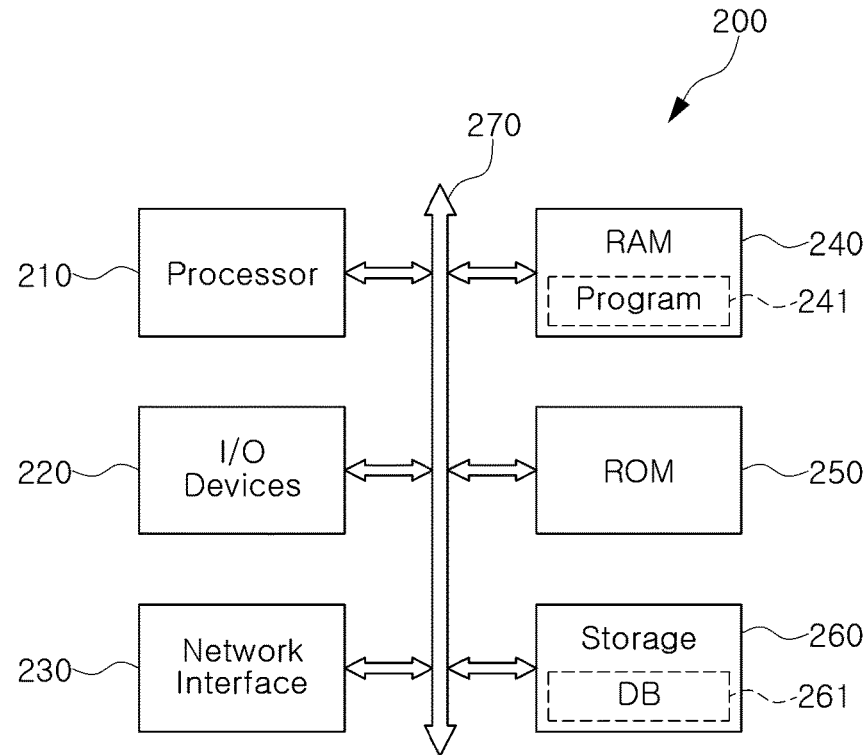
FIG. 13 is a block diagram illustrating a computing system including a memory for storing a program according to some example embodiments.

FIG. 13 is a block diagram illustrating a computing system including a memory for storing a program according to some example embodiments. At least some of operations included in a method of manufacturing a semiconductor device (e.g., the method of FIG. 1) and a method of designing a layout of a semiconductor device (e.g., the method of FIG. 4) according to some example embodiments of inventive concepts may be performed in a computing system 200.

The computing system 200 may be a stationary computing system, such as one or more of a desktop computer, a workstation, a server, or the like, or a portable computing system, such as a laptop computer or the like. As illustrated in FIG. 13, the computing system 200 may include a processor 210, input/output devices 220, a network interface 230, a random access memory (RAM) 240, a read only memory (ROM) 250, and a storage device 260. The processor 210, the input/output devices 220, the network interface 230, the RAM 240, the ROM 250, and the storage device 260 may be connected to a bus 270, and may communicate with each other through the bus 270, e.g. communicate in a wired and/or a wireless manner, e.g. serially and/or in a parallel manner.

According to various example embodiments of inventive concepts, a method of designing a layout of a semiconductor device and a method of manufacturing the semiconductor device, having improved integration and/or reliability may be provided by analyzing a first layout and correcting then at least a portion of filler cells among a plurality of filler cells of the first layout, to form a second layout.

Various advantages and effects of inventive concepts are not limited to the above, and will be more easily understood in the process of describing various example embodiments of inventive concepts.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While some example embodiments have been illustrated and described above, it will be apparent to those of ordinary skill in the art that modifications and variations could be made without departing from the scope of inventive concepts as defined by the appended claims.

What is claimed is:

1. A method of designing a layout of a semiconductor device, comprising:

arranging a plurality of standard cells;

forming a first layout by placing a plurality of filler cells between the plurality of standard cells; and forming a second layout by analyzing the first layout and correcting at least a portion of the plurality of filler cells, wherein the plurality of standard cells includes a first standard cell including a first active line having a first width, and a second standard cell including a second active line having a second width, different from the first width, in the first layout, and the plurality of filler cells includes a first filler cell including a dummy active line connected to the first active line and to the second active line, and dummy gate lines intersecting the dummy active line, in the first layout, wherein the forming the second layout includes:

detecting transition regions corresponding to a difference in width by respectively comparing the first width of the first active line and the second width of the second active line with a width of the dummy active line, in the first layout; and correcting the dummy active line of the first filler cell by analyzing the detected transition regions, wherein, in the correcting the dummy active line of the first filler cell, the method includes correcting the dummy active line to be a corrected dummy active line having the same width as an active line having a narrower width, among the first and second active lines, the method includes forming a corrected transition region between an active line having a wider width, among the first and second active lines, and the corrected dummy active line, and the corrected transition region overlaps a first dummy gate line located on a first boundary of the first filler cell, among the dummy gate lines.

2. The method of claim 1, wherein the detecting transition regions in the first layout comprises identifying a region having discontinuously changing widths in regions in which the dummy active line and the first and second active lines are connected.

3. The method of claim 1, wherein the corrected transition region faces a central portion of the first filler cell.

4. The method of claim 1, wherein the corrected transition region faces a second dummy gate line located on a second boundary of the first filler cell, among the dummy gate lines.

5. The method of claim 4, wherein the first boundary and the second boundary extend in parallel with each other.

6. The method of claim 5, wherein the first standard cell further comprises first gate lines intersecting the first active line, and first gate contacts overlapping the first gate lines, the second standard cell further comprises second gate lines intersecting the second active line, and second gate contacts overlapping the second gate lines, and gate contacts are not arranged on the first dummy gate line on the first boundary and on the second dummy gate line on the second boundary.

7. The method of claim 1, wherein the first and second active lines extend in a first direction, and the dummy gate lines extend in a second direction, perpendicular to the first direction.

8. The method of claim 1, wherein the first filler cell is arranged between the first standard cell and the second standard cell.

9. The method of claim 1, wherein the second width is wider than the first width, and in the second layout, a transition region is not formed between the corrected dummy active line and the first active line.

10. A method of manufacturing a semiconductor device, comprising:

forming a semiconductor layout using the method of claim 1;

forming a mask using the semiconductor layout; and forming the semiconductor device using the mask, wherein, in the forming the semiconductor device, the forming includes forming a first active pattern having a third width in a first device region corresponding to the first standard cell, a second active pattern having a fourth width, different from the third width, in a second device region corresponding to the second standard cell, a dummy active pattern disposed between the first and second device regions and having a fifth width, equal to a narrower width among the third width and the fourth width, in a dummy region corresponding to the first filler cell, and a first dummy gate pattern corresponding to the first dummy gate line on the first boundary on a semiconductor substrate, the forming the semiconductor device further includes forming a tapered region corresponding to the corrected transition region and continuously changing in width in plan view, at least a portion of the tapered region overlaps the first dummy gate pattern, and a central portion of the tapered region is shifted from a central axis of the first dummy gate pattern in a direction away from the first boundary.

11. The method of claim 10, wherein the central portion of the tapered region is in the dummy region.

12. The method of claim 10, wherein the tapered region provides an inclined surface to the dummy active pattern in the dummy region.

13. The method of claim 10, wherein the dummy region is between the first device region and the second device region.

14. The method of claim 10, wherein the forming the semiconductor device comprises forming a plurality of first channel layers on the first active pattern, a plurality of second channel layers on the second active pattern, and a plurality of dummy channel layers on the dummy active pattern.

15. The method of claim 14, wherein the forming the semiconductor device further comprises forming first gate patterns intersecting the first active pattern and surrounding at least a portion of the plurality of first channel layers, and second gate patterns intersecting the second active pattern and surrounding at least a portion of the plurality of second channel layers.

16. A method of manufacturing a semiconductor device, comprising:

forming a semiconductor layout; and forming the semiconductor device using a mask corresponding to the semiconductor layout, wherein the forming the semiconductor device, includes:

forming a first active pattern on a first device region of a substrate, a second active pattern on a second device region of the substrate, and a dummy active pattern on a dummy region of the substrate;

forming a plurality of first channel layers on the first active pattern, a plurality of second channel layers on the second active pattern, and a plurality of dummy channel layers on the dummy active pattern; and forming a first gate pattern surrounding at least a portion of the plurality of first channel layers, a second gate pattern surrounding at least a portion of the plurality of second channel layers, and dummy gate patterns surrounding at least a portion of the plurality of dummy channel layers, wherein the first active pattern has a first width, the second active pattern has a second width, different from the first width, and the dummy active pattern has a width, equal to a narrower width, among the first width and the second width, the forming the dummy active pattern includes forming a tapered region continuously changing in width in plan view, at least a portion of the tapered region overlaps a first dummy gate pattern arranged in an outermost portion of the dummy region among the dummy gate patterns, and a central portion of the tapered region is in the dummy region, and is shifted from a central axis of the first dummy gate pattern toward a central portion of the dummy region.

17. The method of claim 16, wherein at least one of the plurality of dummy channel layers is a tapered channel layer including a portion in which a width in plan view continuously changes in a region overlapping the first dummy gate pattern.

18. The method of claim 17, wherein the portion in which a width in plan view continuously changes provides an inclined surface to face the central portion of the dummy region in the plan view.

19. The method of claim 16, wherein a width of an uppermost dummy channel layer of the plurality of dummy channel layers is equal to a narrower width from among a width of an uppermost first channel layer of the plurality of first channel layers and a width of an uppermost second channel layer of the plurality of second channel layers.

20. The method of claim 16, wherein the forming the semiconductor device further comprises:

recessing the first active pattern from a first and a second side of the first gate pattern, recessing the second active pattern from a first and a second side of the second gate pattern, and recessing the dummy active pattern from a first and a second side of the dummy gate patterns; and forming first source/drain regions on the recessed first active pattern, second source/drain regions on the recessed second active pattern, and dummy source/drain regions on the recessed dummy active pattern.

\*   \*   \*   \*   \*